United States Patent
Pichai et al.

(10) Patent No.: US 10,888,024 B1
(45) Date of Patent: Jan. 5, 2021

(54) DATA CENTER REFRIGERATION SYSTEM

(71) Applicant: Equinix, Inc., Redwood City, CA (US)

(72) Inventors: Tikhon Suresh Pichai, Simpsonville, SC (US); Douglas James Asay, San Jose, CA (US); Bhavin Raju Shah, Sunnyvale, CA (US)

(73) Assignee: EQUINIX, INC., Redwood City, CA (US)

( * ) Notice: Subject to any disclaimer, the term of this patent is extended or adjusted under 35 U.S.C. 154(b) by 172 days.

(21) Appl. No.: 16/115,199

(22) Filed: Aug. 28, 2018

Related U.S. Application Data

(60) Provisional application No. 62/551,064, filed on Aug. 28, 2017.

(51) Int. Cl.
| | | |
|---|---|---|
| *F04B 43/02* | (2006.01) | |
| *H05K 7/20* | (2006.01) | |
| *F25B 41/04* | (2006.01) | |
| *F25B 27/02* | (2006.01) | |

(52) U.S. Cl.
CPC ......... *H05K 7/20327* (2013.01); *F04B 43/02* (2013.01); *F25B 27/02* (2013.01); *F25B 41/04* (2013.01); *H05K 7/208* (2013.01); *H05K 7/20318* (2013.01)

(58) Field of Classification Search
CPC .......... H05K 7/20327; H05K 7/20318; H05K 7/208
See application file for complete search history.

(56) References Cited

U.S. PATENT DOCUMENTS

| | | | | |
|---|---|---|---|---|
| 4,483,154 | A * | 11/1984 | Smeal | F03G 7/00 62/235.1 |
| 6,270,681 | B1 * | 8/2001 | Gray | C02F 3/145 210/747.9 |
| 6,466,442 | B2 | 10/2002 | Lin | |
| 6,508,301 | B2 | 1/2003 | Marsala | |
| 2005/0072800 | A1 * | 4/2005 | Smith | B67D 1/107 222/129.2 |
| 2010/0263881 | A1 * | 10/2010 | Fritz | A62C 35/68 169/13 |
| 2012/0045350 | A1 * | 2/2012 | Wheal | F04B 43/0736 417/395 |

OTHER PUBLICATIONS

Saums et al., "Vaporizable Dielectric Fluid Cooling for IGBT and Power Semiconductor Applications," 27th Annual IEEE Semiconductor Thermal Measurement and Management Symposium, Mar. 20-24, 2011, 2 pp.

(Continued)

*Primary Examiner* — Filip Zec
(74) *Attorney, Agent, or Firm* — Shumaker & Sieffert, P.A.

(57) ABSTRACT

An apparatus includes a pump and a driver mechanically coupled to the pump. The driver is configured to receive gaseous refrigerant at a first pressure, discharge gaseous refrigerant at a second pressure, and produce a mechanical force from a pressure differential between the first pressure and the second pressure. The pump is configured to receive liquid refrigerant at a third pressure, discharge liquid refrigerant at a fourth pressure, and pump liquid refrigerant from the third pressure to the fourth pressure in response to the mechanical force from the driver.

19 Claims, 11 Drawing Sheets

(56) References Cited

OTHER PUBLICATIONS

"Double Diaphragm Pumps Concept and Theory," Graco, Inc., Form No. 321-048 1/96, 1996 (Applicant points out, in accordance with MPEP 609.04(a), that the year of publication, 1996, is sufficiently earlier than the effective U.S. filing date, 2017, so that the particular month of publication is not in issue.) 31 pp.

"Components Overheating," Zutacore, 2015 (Applicant points out, in accordance with MPEP 609.04(a), that the year of publication, 2015, is sufficiently earlier than the effective U.S. filing date, so that the particular month of publication is not in issue.) 4 pp.

* cited by examiner

US 10,888,024 B1

DATA CENTER REFRIGERATION SYSTEM

This application claims the benefit of U.S. Provisional Patent Application 62/551,064, filed Aug. 28, 2017, the entire content of which is incorporated herein by reference.

TECHNICAL FIELD

The invention relates to data center refrigeration systems and, more specifically, to refrigeration systems for computing devices in data centers.

BACKGROUND

Ensuring ambient temperatures within data centers for effective computer processor operations is a significant cost for data center providers. Processors used in high performance computing servers generate a significant amount of heat during operation. Processors typically must operate in a range of ambient temperatures to prevent failure due to overheating. Liquid cooling systems that supply liquid refrigerant to the processors efficiently transfer heat away from the processors.

SUMMARY

In general, techniques are described for powering transportation of refrigerant to computing processors in a data center using waste heat generated by the processors. For example, a pump supplies refrigerant to heat exchangers thermally coupled to the processors. The refrigerant removes heat from the processors and exits the heat exchangers as gaseous refrigerant. A driver uses the gaseous refrigerant to create a pressure differential in the driver. The pressure differential expands the driver and creates a mechanical force, which is used to power the pump. The gaseous refrigerant is condensed and continues the cycle described above. The refrigeration system may use a reduced amount of power, for the driver may power the pump without electricity or gas. An increase in heat generated from the processors may directly increase power to the pump.

In one example, an apparatus includes a pump and a driver mechanically coupled to the pump. The driver is configured to receive gaseous refrigerant at a first pressure, discharge gaseous refrigerant at a second pressure, and produce a mechanical force from a pressure differential between the first pressure and the second pressure. The pump is configured to receive liquid refrigerant at a third pressure, discharge liquid refrigerant at a fourth pressure, and pump liquid refrigerant from the third pressure to the fourth pressure in response to the mechanical force from the driver.

In another example, a system includes the pump and drive described above, a system inlet fluidically coupled to the driver, a system outlet fluidically coupled to the pump, and a condenser fluidically coupled to the driver and the pump. The system inlet is configured to receive gaseous refrigerant at the first pressure from at least one heat exchanger. The system outlet is configured to discharge liquid refrigerant at the second pressure to the at least one heat exchanger. The condenser is configured to condense gaseous refrigerant to liquid refrigerant.

In another example, a method includes receiving, by a system inlet, gaseous refrigerant from at least one heat exchanger. The system inlet is fluidically coupled to a driver and the at least one heat exchanger. The method further includes producing, by the driver, an alternating mechanical force from an alternating pressure differential of the gaseous refrigerant. The driver is mechanically coupled to a pump. The method further includes condensing, by a condenser, the gaseous refrigerant to a liquid refrigerant. The condenser is fluidically coupled to the driver and the pump. The method further includes pumping, by the pump, the liquid refrigerant from the condenser to a system outlet in response to the mechanical force from the driver. The method further includes discharging, by the system outlet, the liquid refrigerant to the at least one heat exchanger. The system outlet is fluidically coupled to the pump and the at least one heat exchanger.

This disclosure also describes methods, computer readable storage media, computing devices, systems, for performing techniques described herein. The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference characters denote like elements throughout the figures and text.

DETAILED DESCRIPTION

Figure 1:
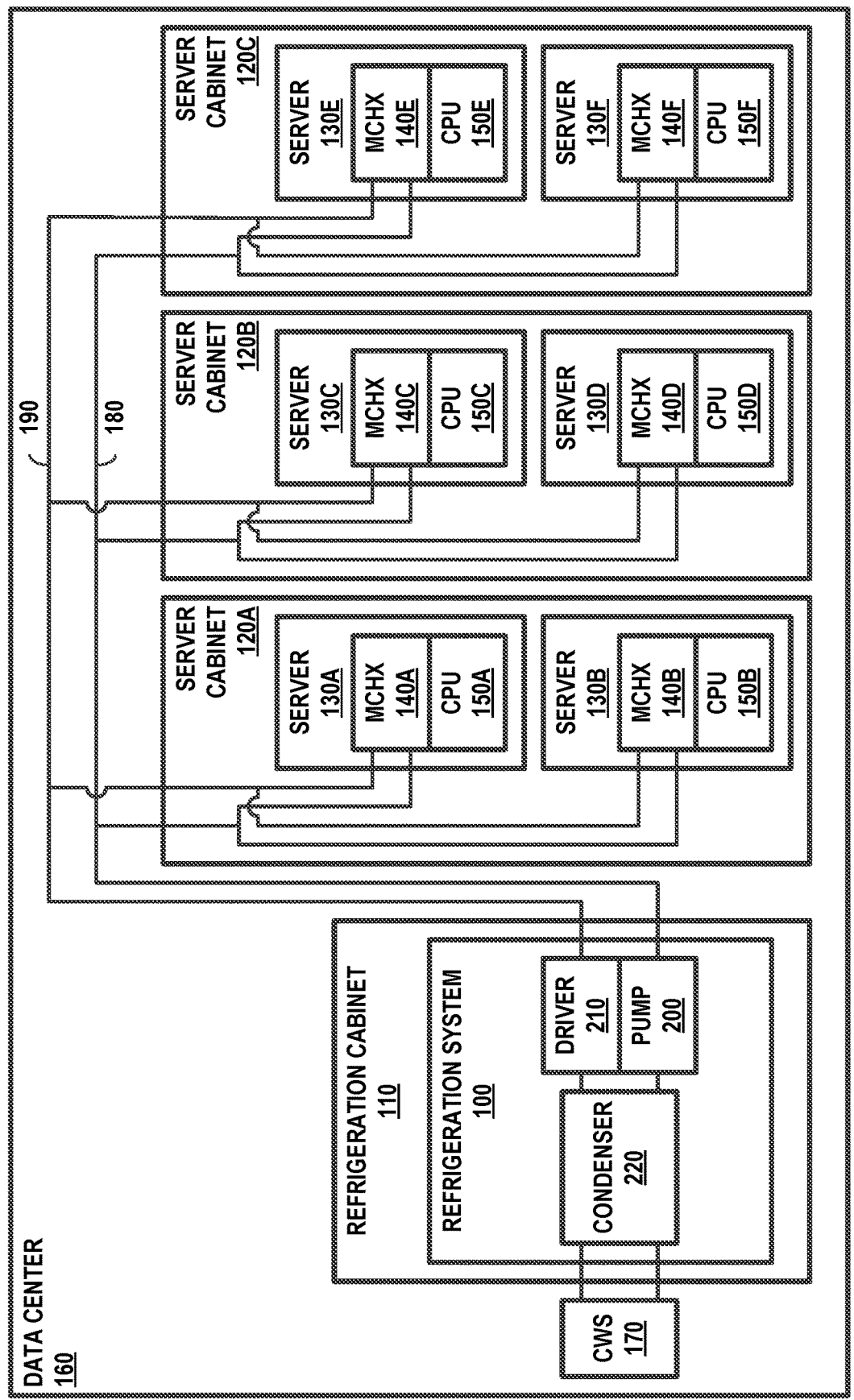
FIG. 1 is a block diagram illustrating a high-level view of an example data center that includes a refrigeration system, in accordance with techniques described herein.

A data center may use a refrigeration system to remove heat from operating processors. FIG. 1 is a block diagram illustrating a high-level view of an example data center 160 that includes a refrigeration system 100 for cooling one or more processors 150A-F (illustrated as central processing units ("CPUs"), referred to individually as "CPU 150" and collectively as "CPUs 150") using one or more heat exchangers 140A-F ("HEX", referred to individually as "HEX 140" and collectively as "HEXs 140"), in accordance with techniques described herein. Rather than provide bulk, convective cooling as in air cooling, HEXs 140 may provide localized heat removal from CPUs 150 using refrigerant.

Data center 160 may include one or more server cabinets 120A-C (referred to individually as "server cabinet 120" and collectively as "server cabinets 120"). While three server cabinets are shown, a data center may have any number of server cabinets. In some examples, server cabinets 120 may be owned, leased, or otherwise assigned to one or more customers or tenants of the data center, such that the customer maintains custody of the contents of the respective server cabinet 120. Data center 160 may also include a refrigeration cabinet 110 that includes a refrigeration system 100. Refrigeration cabinet 110 may be located separate from server cabinets 120, such as in another room or building. In some examples, refrigeration cabinet 110 may be owned or otherwise controlled by an operator of data center 160, such that refrigeration system 100 is configured to provide a cooling service to a customer of server cabinets 120. Cooling water system 170 ("CWS") may be fluidically coupled to refrigeration system 100 and configured to remove heat from refrigeration system 100. In some examples, CWS 170 may be controlled by a third party, such as a municipality or company, while in other examples, CWS 170 may be part of data center 160.

Each server cabinet 120 may be configured to store one or more servers 130A-F (referred to individually as "server 130" and collectively as "servers 130"). Each server 130 may include one or more CPUs 150 thermally coupled to one or more HEXs 140. Each CPU 150 may be configured to provide processing power to a respective server 130. Examples of CPU 150 may include any one or more of a microprocessor, controller, digital signal processor (DSP), application specific integrated circuit (ASIC), field-programmable gate array (FPGA), or equivalent discrete or integrated logic circuitry. While only one CPU 150 is shown for each server 130, each server 130 may have multiple CPUs 150.

During operation, CPUs 150 produce heat which must be removed to prevent overheating. Each HEX 140 is configured to remove heat from a corresponding CPU 150. While only one HEX 140 is shown for each server 130, each server 130 may have multiple HEXs, and each HEX 140 may remove heat from one or more CPUs 150 in some examples. HEX 140 may be thermally coupled to at least one surface of CPU 150 directly, through a conductive medium such as a thermally conductive adhesive, or by any other mechanism that provides for conductive heat transfer from CPU 150 to HEX 140. In some examples, HEX 140 may be thermally coupled to more than one CPU 150, such as in a sandwiched configuration or through a contoured contact surface. HEX 140 may include one or more ("a plurality of") channels. In some examples, each of the one or more channels of HEX 140 may have a diameter in a range from about 1/64 inch to about 1/8 inch. In some examples, HEX 140 may be a microchannel heat exchanger and the one or more channels may be microchannels having a diameter less than or equal to about 1 mm. Each HEX may be configured to receive a refrigerant at a channel inlet and discharge the refrigerant at a channel outlet. HEX 140 may be configured to accommodate two phases of the refrigerant during operation, such that the channel inlet receives liquid refrigerant and the channel outlet discharges gaseous refrigerant.

Each HEX 140 may be fluidically coupled to refrigeration system 100 through refrigeration piping. Refrigeration system 100 may use refrigerant to remove heat from CPU(s) 150. Refrigeration system 100 may be configured to remove heat from HEXs 140 by supplying refrigerant to and removing refrigerant from HEXs 140. Refrigerant may be selected such that refrigerant enters HEX 140 as subcooled liquid and exits HEX 140 as superheated vapor for the particular operating conditions at which refrigeration system 100 and CPU(s) 150 are intended to operate. For example, the refrigerant may be selected for use in refrigeration system 100 such that the properties of the refrigerant, such as temperature and pressure, may be controlled through all stages of the refrigeration cycle to maintain CPU(s) 150 at a junction temperature below a temperature threshold or setpoint. In some examples, the junction temperature may be substantially higher (for example, at about 190° F.) than a boiling temperature of the refrigerant, such that the refrigerant will readily vaporize. The refrigerant may be any non-conductive, non-flammable fluid. Factors for selecting refrigerant may include boiling point, heat capacity, CPU operating temperature, refrigerant saturation temperature and pressure, specific enthalpy, condenser water system operating temperature, and other factors that affect phase change, thermal, physical, and/or chemical stability, or economic and safety considerations of the refrigerant. Refrigeration piping may include liquid refrigerant piping 180 for supplying subcooled liquid refrigerant to HEXs 140 and gaseous refrigerant piping 190 for discharging superheated vapor refrigerant from HEXs 140. Refrigeration system 100 may include a pump 200, a driver 210, and a condenser 220 that are configured such that heat removed from HEXs 140 may be used by driver 210 to power pump 200, as will be described in more detail in FIGS. 2-6 below.

During operation, refrigeration system 100 may pump subcooled liquid refrigerant from refrigeration cabinet 110 to server cabinets 120. Liquid refrigerant enters HEXs 140, removes heat from HEXs 140 at a channel interface, and exits HEXs 140 as superheated gaseous refrigerant. The superheated gaseous refrigerant is transported to refrigeration system 100, where it is used to pressurize driver 210 and, in turn, power pump 200 before being condensed by cooling water from CWS 170. By remotely supplying refrigerant to locally cool CPUs 150, refrigeration system 100 may safely and efficiently keep CPUs 150 below a threshold temperature.

Refrigeration systems may require substantial power to circulate refrigerant through small and remote heat exchangers. For example, a heat exchanger configured to remove heat from a processor may have channels less than 1 mm, requiring substantial pumping power to pump refrigerant through the channels. The processors cooled by the refrigeration system may be located a significant distance from the refrigeration system, requiring substantial pumping power to pump refrigerant to each server cabinet. Further, power requirements may fluctuate as servers use varying amounts of power and produce varying amounts of heat, resulting in equipment sized and maintained for high levels of service that may not be needed.

Figure 2:
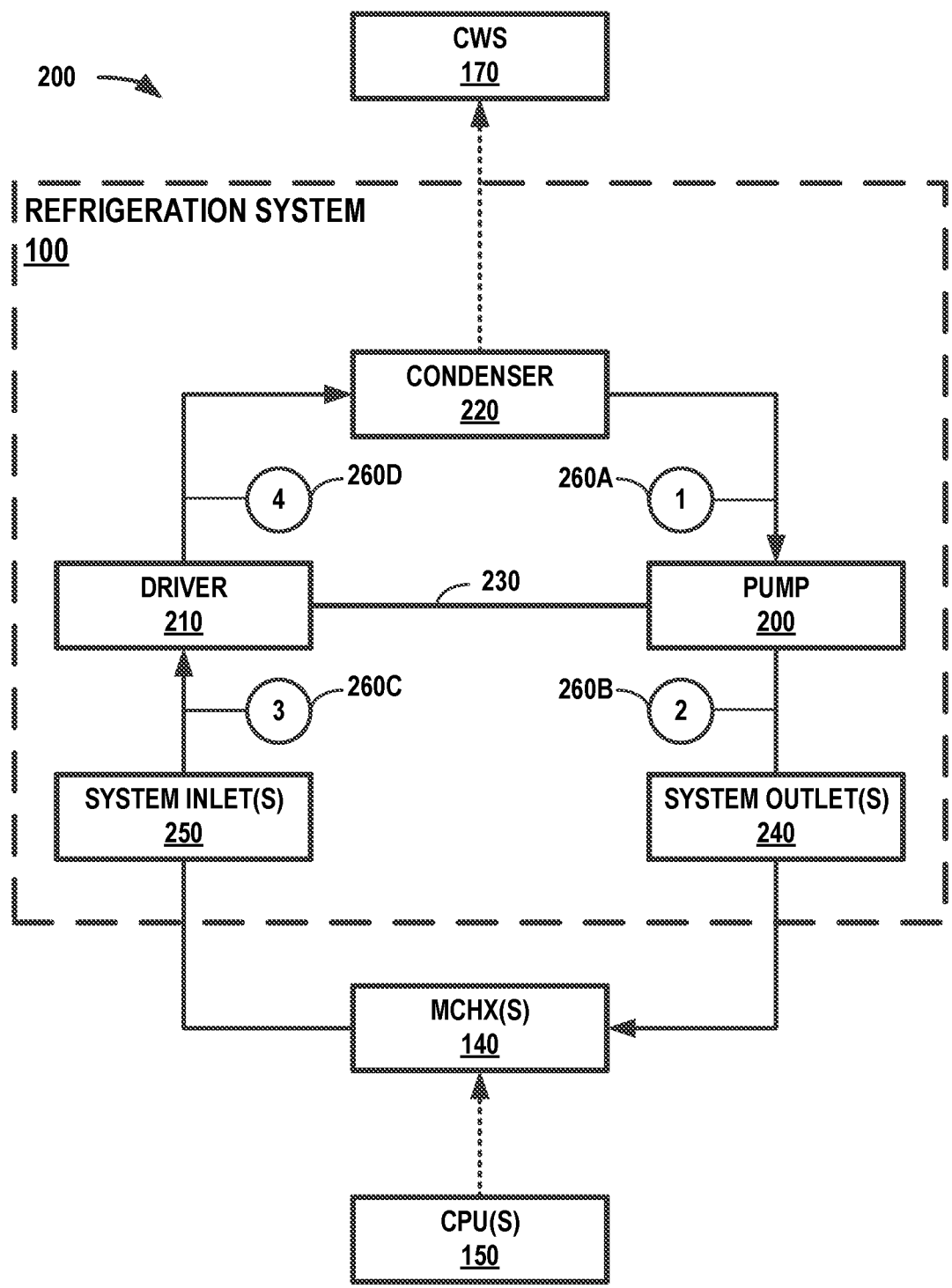
FIG. 2 is a block diagram illustrating a high-level view of an example refrigeration system, in accordance with techniques described herein.

According to principles of the disclosure, a refrigeration system may remove heat from one or more processors and convert a portion of the heat to mechanical energy used to pump refrigerant through the refrigeration system. FIG. 2 is a block diagram that illustrates a high-level view of a system 200 for removing heat from a CPU 150, in accordance with techniques described herein. System 200 may include one or more CPU(s) 150, each thermally coupled to one or more HEX(s) 140, and a refrigeration system 100 fluidically coupled to one or more HEX(s) 140 on a hot side and CWS 170 on a cold side, as described in FIG. 1. Refrigeration system 100 may include one or more system inlet(s) 250, one or more system outlet(s) 240, a driver 210, a pump 200, and a condenser 220. Refrigeration system 100 may be configured to remove heat from HEXs 140 by supplying refrigerant to and removing refrigerant from HEXs 140 using reduced energy inputs.

System inlet(s) 250 and system outlet(s) 240 may represent connection points of one or more HEX(s) 140 to refrigeration system 100. System inlet 250 and system outlet 240 may be configured to fluidically couple to an outlet and an inlet, respectively, of one or more HEX(s) 140. Once coupled, system inlet 250 may be configured to receive gaseous refrigerant from the outlet of the one or more HEX(s) 140, while system outlet 240 may be configured to discharge liquid refrigerant to the inlet of the one or more HEX(s) 140. In some examples, system inlet 250 or system outlet 240 may include a single connection, such as a flange. In some examples, system inlet(s) 250 may be configured to receive substantially gaseous refrigerant and system outlet(s) 240 may be configured to discharge substantially liquid refrigerant.

In some examples, system inlet(s) 250 and system outlet(s) may include multiple connections, such as a manifold. In some examples, system inlet 250 and system outlet 240 may include at least one connection for each server cabinet or each customer cage. For example, each server cabinet may include a manifold coupled to a main branch of refrigeration system 100. In the example of FIG. 1, each server cabinet includes two servers 130. An outlet of each HEX 140 of the servers 130 may be fluidically coupled to a system inlet manifold. Similarly, an inlet of each HEX 140 may be coupled to a system outlet manifold. Each system inlet manifold and system outlet manifold may represent the respective system inlet 250 and system outlet 240. The manifold may be configured with multiple system outlets 240, each system outlet 240 configured to distribute refrigerant to each HEX 140 in the respective server cabinet. In some examples, each manifold may include additional control equipment for the corresponding server cabinet. For example, the manifold may include a temperature regulating device configured to maintain a particular temperature or saturation of gaseous refrigerant exiting HEX 140, such as superheat of the gaseous refrigerant. Each system outlet 240 to a HEX 140 may include a flow regulating valve configured to maintain a superheated gaseous refrigerant at an outlet of HEX 140.

Pump 200 may be configured to pump refrigerant through refrigeration system 100. Pump 200 may be fluidically coupled to condenser 220 and system outlet(s) 240. Pump 200 may be mechanically coupled to driver 210 through mechanical link 230. Pump 200 may be configured to receive liquid refrigerant at a first pressure from condenser 220 and discharge liquid refrigerant at a second pressure to system outlet(s) 240 in response to a mechanical force from driver 210. Pump 200 may include any positive displacement pump that can translate an alternating mechanical force into liquid refrigerant displacement, including any one of diaphragm pumps, piston pumps, and the like. Pump 200 may include one or more inlets and one or more outlets. In some examples in which pump 200 is a piston or diaphragm pump, pump 200 may have two inlets and two outlets, as will be described later in FIGS. 3, 4A, and 4B.

Driver 210 may be configured to drive pump 200 through expansion using gaseous refrigerant vaporized in HEX(s) 140 by heat exhausted from CPU(s) 150. Driver 210 may be fluidically coupled to system inlet(s) 250 and condenser 220. Driver 210 may be mechanically coupled to pump 200 through mechanical link 230. Driver 210 may be configured to receive gaseous refrigerant at a third pressure from system inlet(s) 250 and discharge gaseous refrigerant at a fourth pressure to condenser 220. In some instances, the third pressure may be substantially similar to the second pressure discharged by pump 200, and the fourth pressure may be substantially similar to the first pressure received by pump 200. Driver 210 may control the gaseous refrigerant to produce a pressure differential between the first and second pressure that, in turn, expands a chamber of driver 210 to produce the mechanical force. Driver 210 may include any fluid driver than can translate a pressure differential caused by gaseous refrigerant into a mechanical force, including any one of diaphragm drivers, piston drivers, and the like. Driver 210 may include one or more inlets and one or more outlets. In some examples in which driver 210 is a piston or diaphragm driver, driver 210 may have two inlets and two outlets, as will be described later in FIGS. 3, 4A, and 4B.

Mechanical link 230 may be mechanically coupled to pump 200 and driver 210.

Mechanical link 230 may be configured to transfer the mechanical force from driver 210 to pump 200. Mechanical link 230 may be any mechanical connection that can transfer the mechanical force, including simple mechanical devices, such as rods and shafts; complex mechanical devices, such as gearboxes and translational machines; fluid systems, such as hydraulic systems; and the like.

Condenser 220 may be configured to condense the refrigerant from the gaseous refrigerant to the liquid refrigerant. Condenser 220 may be fluidically coupled to driver 210 and pump 200 on a hot side and configured to receive refrigerant from driver 210 and discharge refrigerant to pump 200. Condenser 220 may be fluidically coupled to CWS 170 on a cold side and configured to receive cooling water from and discharge cooling water to CWS 170. Condenser 220 may include any two-phase heat exchanger including shell and tube, finned tube, and the like.

Figure 6:
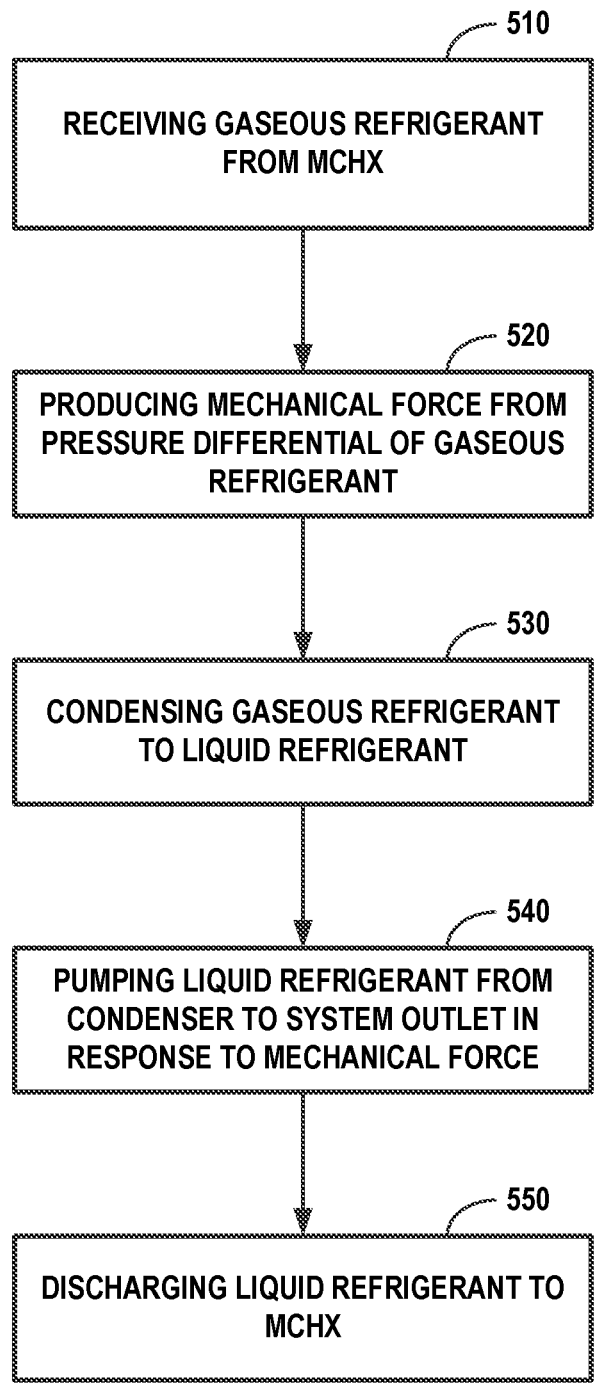
FIG. 6 is an example flow diagram of a process for cooling a CPU using a refrigeration system, in accordance with techniques described herein.

Refrigeration system 100 may operate to remove heat from CPU(s) by circulating refrigerant through HEX(s) 140 using a mechanical force generated from heat removed from the processors. FIG. 6 is an example flow diagram of a process for cooling a CPUs 150 using refrigeration system 100. FIG. 6 may be described with reference to FIG. 2, including refrigeration state point (1) 260A, state point (2) 260B, state point (3) 260C, and state point (4) 260D; however, it is understood that the FIG. 6 may be implemented using other systems, and that FIG. 2 may implement other methods. A system inlet, such as system inlet 250, may receive gaseous refrigerant from at least one heat exchanger, such as HEX(s) 140 (510). The system inlet may be fluidically coupled to a driver, such as driver 210, and the at least one heat exchanger. The driver may produce a mechanical force from a pressure differential of the gaseous refrigerant (520), such as between a pressure of state (3) 260C and a pressure of state (4) 260D. The driver may be mechanically coupled to a pump, such as pump 200. A condenser, such as condenser 220, may condense the gaseous refrigerant to a liquid refrigerant (530), such as from a temperature and pressure of state (4) 260D to a temperature and pressure of state (1) 260A. The condenser may be fluidically coupled to the driver and the pump. The pump may pump the liquid refrigerant from the condenser to a system outlet, such as system outlet 240, in response to the mechanical force from the driver (540), such as from a pressure of state (1) 260A to a pressure of state (2) 260B. The system outlet may discharge the liquid refrigerant to the at least one heat exchanger (550). The system outlet may be fluidically coupled to the pump and the at least one heat exchanger. The heat exchanger may heat liquid refrigerant to a gaseous refrigerant, such as from a temperature of state (2) 260B to a temperature of state (3) 260C. By using heat from CPU(s) 150 to create a motive force for powering pump 200, refrigerant system 100 may require less electrical power than a system that solely uses electrical power to pump refrigerant.

As described in FIG. 2, driver 210 and pump 200 may produce a mechanical force from a pressure differential of gaseous refrigerant and use the mechanical force to pump liquid refrigerant. The gaseous refrigerant may have a higher enthalpy than the liquid refrigerant due to heating of the refrigerant by HEX 140. The pressure differential in driver 210 may be created by a higher pressure gaseous refrigerant entering into a first chamber of driver 210 from HEX 140 and a lower pressure gaseous refrigerant exiting from a second chamber of driver 210 to condenser 220. The pressure differential may drive expansion of the first chamber of driver 210 to create the mechanical force that powers pump 200. In this way, heat produced by CPU 150 may be converted to mechanical energy that powers circulation of refrigeration system 100.

Figure 3:
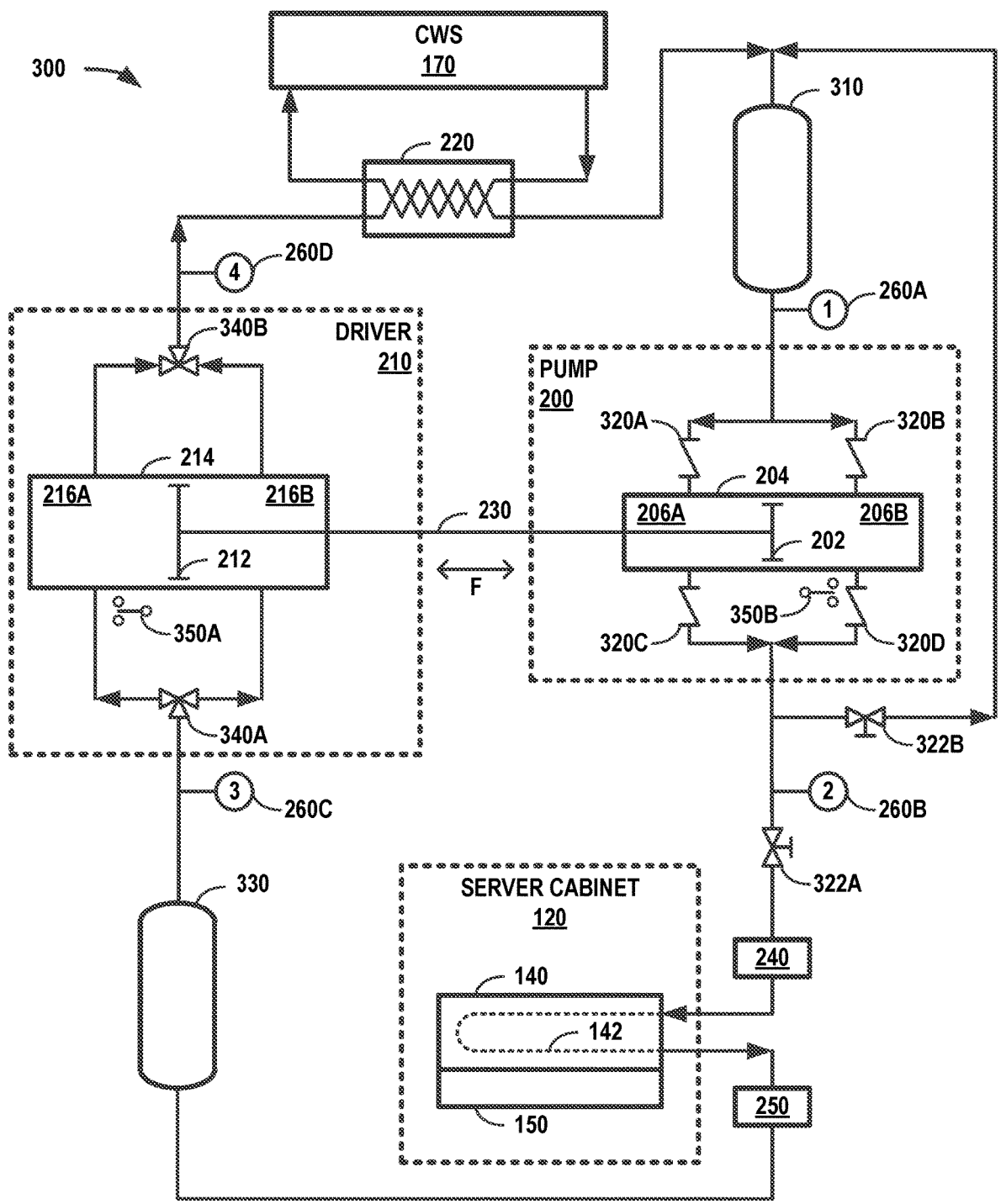
FIG. 3 is an example instrumentation diagram illustrating a component-level view of an example refrigeration system, in accordance with techniques described herein.

FIG. 3 is an instrumentation diagram illustrating a component-level view of an example refrigeration system, in accordance with techniques described herein. In the example of FIG. 3, system 300 includes a two-phase refrigerant that is circulated by a piston pump and driver, as will be described below. However, other equipment and configurations may be used, as would be consistent with the principles of the disclosure.

System 300 may include a liquid receiver 310. Liquid receiver 310 may be fluidically coupled to condenser 220 and pump 200 through pump inlet valves 310A and 310B. Liquid receiver 310 may be configured to store pressurized, subcooled liquid refrigerant. Liquid receiver 310 may receive liquid refrigerant from condenser 220 and supply liquid refrigerant to pump 200. Liquid receiver 310 may be any vessel that stores liquid refrigerant under pressure, such as pressures in a range from about 50 psig to about 125 psig.

System 300 includes pump 200. Pump 200 may be fluidically coupled to liquid receiver 310 through pump inlet valves 320A and 320B and fluidically coupled to HEX 140 through pump outlet valves 320C and 320D (collectively "pump valves 320"). Pump valves 320 may be configured to direct flow into and out of pump 200. For example, one of pump inlet valves 320A and 320B may allow liquid to flow from receiver 310 into pump 200 while the other of pump inlet valves 320A and 320B may prevent flow of liquid from pump 200 back into receiver 310. Similarly, one of pump outlet valves 320C and 320D may allow liquid to flow from pump 200 to HEX 140, while the other of pump outlet valves 320C and 320D may prevent flow from HEX 140 back into pump 200. In the example of FIG. 3, pump inlet valves 310A and 310B and pump outlet valves 310C and 310D are check valves. In other examples, the four pump valves 320 may be replaced with two respective 3-way valves.

Pump 200 may include a pump vessel 204 and a moveable pump barrier, such as piston 202. In the example of FIG. 3, piston 202 may separate vessel 204 into two variable volume pump chambers 206A and 206B. Pump 200 may be configured to alternately expand and contract the first and second pump chambers 206A and 206B in response to the mechanical force from driver 210.

Pump chamber 206A may be fluidically coupled to pump inlet valve 320A and pump outlet valve 320C, while pump chamber 206B may be fluidically coupled to pump inlet valve 320B and pump outlet valve 320D. Piston 202 may be coupled to mechanical link 230 and configured to move in response to a mechanical force from driver 210. In some examples, the mechanical force may be a linear force, while in other examples, a mechanical advantage of mechanical link 230 may be adjusted, such as through gearing or levered mechanisms. Movement of piston 202 alternatingly increases or decreases a volume of chamber 206A and 206B in reverse direction to one another, such that a first volume of fluid may flow out of the decreasing volume and a second volume of fluid may flow into the increasing volume. In the example of FIG. 3, pump 200 uses a piston; however, in other examples, piston 202 may be replaced with a diaphragm or other moveable driver barrier that can change a volume of one or more chambers in response to mechanical force F.

As discussed in FIG. 2, pump 200 may include any positive displacement pump capable of translating a reciprocating mechanical force into liquid refrigerant displacement. In the example of FIG. 3, pump 200 may be a piston or diaphragm capable of translating a linear reciprocating mechanical force into fluid displacement. In other examples, pump 200 may be a rotary positive displacement pump capable of translating a linear reciprocating mechanical force into a rotary force that displaces liquid refrigerant.

System 300 may include system outlet(s) 240 and system inlet(s) 250. While system outlet(s) 240 and system inlet(s) 250 are shown coupled to a single HEX 140 in a single server cabinet 120, system outlet(s) 240 and system inlet(s) 250 may be fluidically coupled to a plurality of HEX(s) 140 in one or more server cabinets 120, as in the example data center 160 of FIG. 1. In some examples, system outlet(s) 240 and system inlet(s) 250 may include components for controlling refrigerant flow into and out of HEX 140, such that, for example, the components of system outlet(s) 240 and system inlet(s) 250 may control a temperature of the gaseous refrigerant exiting HEX(s) 140 to maintain a superheat of the gaseous refrigerant.

System 300 may include flow regulating valves 322A and 322B (collectively "flow regulating valves 322") coupled to an outlet of pump 200. Flow regulating valve 322A may be further coupled to HEX 140 and configured to control flow of liquid refrigerant into HEX 140, temperature out of HEX 140, and/or flow of gas out of HEX 140, such as to maintain a temperature or superheat of gaseous refrigerant exiting HEX 140. Flor regulating valve 322B may be further coupled to receiver 310 and configured to recycle liquid back to receiver 310. Flow regulating valves 322 may operate together to maintain a particular flow rate to HEX 140. For example, flow regulating valves 322 may control flow of liquid into HEX by increasing or decreasing flow of liquid into HEX 140 while correspondingly decreasing or increasing recycle flow into receiver 310. While flow regulating valves 322A and 322B have been described as including a throttling function, in other examples, flow regulating valves 322A and 322B may be replaced with other flow or pressure regulating valves. For example, flow regulating valve 322A may be replaced with an isolation valve to reduce backflow from HEX 140, while flow regulating valve 322B may be a back-pressure regulating valve to maintain a recirculation pressure. While shown upstream of system outlet 240, flow regulating valve 322A, or any other flow control valve for regulating flow from pump 200 into HEX 140, may be located at any position between an outlet of pump 200 and an inlet of HEX 140.

System 300 may include HEX 140. HEX 140 may be fluidically coupled to pump 200 and a gas accumulator 330. In the example of FIG. 3, HEX 140 may be a heat exchanger that includes channels 142; however, in other examples, HEX 140 may have alternative designs. HEX 140 may be configured to transfer heat from CPU 150 to liquid refrigerant. Factors for which HEX 140 may be designed include, but are not limited to, refrigerant viscosity, refrigerant heat capacity, HEX material thermal conductivity, CPU 150 heat generation, and other factors that may affect heat transfer, whether conductive or convective, from CPU 150 to HEX 140 and from HEX 140 to the refrigerant.

System 300 may include gas accumulator 330. Gas accumulator 330 may be fluidically coupled to HEX 140 and driver 210 through driver inlet valve 340A. Gas accumulator 330 may be configured to store pressurized, superheated gaseous refrigerant. Gas accumulator 330 may receive gaseous refrigerant from HEX 140 and supply gaseous refrigerant to driver 210. Gas accumulator 330 may be any vessel that stores gaseous refrigerant under pressure, such as pressures in a range from about 125 psig to about 250 psig.

System 300 includes driver 210. Driver 210 may be fluidically coupled to gas accumulator 330 through driver inlet valve 340A and fluidically coupled to condenser 220 through driver outlet valve 340B (collectively "driver valves 340"). Driver valves 340 may be configured to direct flow into and out of driver 210. For example, driver inlet valve 340A may direct flow of gas from gas accumulator 330 into a first chamber of driver 210 and prevent flow of gas from gas accumulator 330 into a second chamber of driver 210. Concurrently, driver outlet valve 340B may allow gas to flow from the second chamber of driver 210 to condenser 220 and prevent flow from the first chamber of driver 210. In the example of FIG. 3, driver inlet valve 340A and driver outlet valve 340B are 3-way valves.

Driver 210 may include a driver vessel 214 and a moveable driver barrier, such as piston 212. In the example of FIG. 3, piston 212 may separate vessel 214 into two variable volume driver chambers 216A and 216B. In the example of FIG. 3, driver 210 uses a piston; however, in other examples, piston 212 may be replaced with a diaphragm or other reciprocating barrier that can change a volume of one or more chambers of driver 210. Driver 210 may be configured to alternately expand and contract the first and second driver chambers 216A and 216B in response to an alternating pressure differential.

Each of driver chambers 216A and 216B may be fluidically coupled to driver inlet valve 340A and driver outlet valve 340B. Driver 210 may create the alternating pressure differential by alternately supplying gaseous refrigerant at a higher pressure to one of the first and second driver chambers 216A and 216B using driver inlet valve 340A and discharging gaseous refrigerant at a lower pressure from the other of the first and second driver chambers 216A and 216B using driver outlet valve 340B. Driver valves 340 may be configured to produce a mechanical force F by creating a pressure differential between chamber 216A and 216B and expanding one of chambers 216A and 216B. As will be described in more detail in FIGS. 4A and 4B, driver inlet valve 340A may direct gaseous refrigerant into one chamber to pressurize the chamber, and driver outlet valve 340B may direct gaseous refrigerant out of the other chamber to depressurize the other chamber. Piston 212 may be coupled to mechanical link 230. The pressure differential across piston 212 between the pressurized chamber and the depressurized chamber may move piston 212 across vessel 214, which may create mechanical force F through mechanical link 230. Mechanical link 230 couples piston 212 of driver 210 to piston 202 of pump 200 and in this way transfers mechanical force F from driver 210 to pump 200.

System 300 may include switch circuitry such as switch 350A and switch 350B (collectively "switches 350"). Switch 350A may be adjacent driver chamber 216A and switch 350B may be adjacent pump chamber 206B. Switch 350A and switch 350B may be operationally coupled to piston 212 and piston 202, respectively. Switch 350A may be configured to close when piston 212 is positioned near switch 350A, while switch 350B may be configured to close when piston 202 is positioned near switch 350B. Switches 350 may also be operationally coupled to driver valves 340. Switches 350 may detect when a corresponding piston 202, 212, reaches a particular position in corresponding vessel 204, 214. In response to detection of the piston at the particular position, driver valves 350 may switch energized state to reverse the pressure differential across the respective piston and, correspondingly, a direction of mechanical force F. While switches 350 have been described with respect to adjacency to both driver 210 and pump 200, in some examples, switches 350 may be adjacent either to driver chamber 216A and 216B and operationally coupled to piston 212 or to pump chambers 206A and 206B and operationally coupled to piston 202, such that switch circuitry corresponds to either driver 210 or pump 200.

System 300 may include condenser 220. Condenser 220 may be fluidically coupled on a refrigerant side to driver 210 and liquid receiver 310. Condenser 220 may be fluidically coupled on a cooling fluid side to CWS 170. Condenser 220 may be configured to condense gaseous refrigerant. Condenser 220 may receive gaseous refrigerant from driver outlet valve 340B, cool the gaseous refrigerant to obtain liquid refrigerant, and discharge liquid refrigerant to liquid receiver 310. While condenser 220 is described as a shell and tube condenser, condenser 220 may have a variety of forms.

System 300 may include instrumentation for measuring operating conditions of system 300. For example, each state point (1), (2), (3), and (4) 260A-D may include a temperature sensor, such as a thermocouple, configured to detect a refrigerant temperature, and a pressure sensor, such as a pressure transducer, configured to detect a refrigerant pressure. State points (1)-(4) 260A-D may be used to control components of system 300 including, but not limited to, flow regulating valves 322, driver valves 340, cooling water control valves, and the like. Other instrumentation that may be used includes flow meters, such as flow meters for cooling water of CWS 170 and refrigerant; temperature sensors, such as temperature of cooling water and CPU 150, and the like.

While driver 210 and pump 200 have been described as separate units, in some examples, driver 210 and pump 200 may be contained in a same casing or housing. For example, a pump/driver unit may include pump 200, driver 210, pump valves 320, driver valves 340, switches 350, and a controller (not shown). The pump/driver unit may be configured with a variety of design characteristics that include, but are not limited to, surface area ratio of pistons 202 and 210, diameters of vessels 204 and 214, lengths of vessels 204 and 214, number of chambers of vessels 204 and 214, and other design characteristics that may affect the mechanical force generated and transferred through the pump/driver unit. Further, any of these design characteristics may present in individual components, such as pump 200 and driver 210.

Figure 4A:
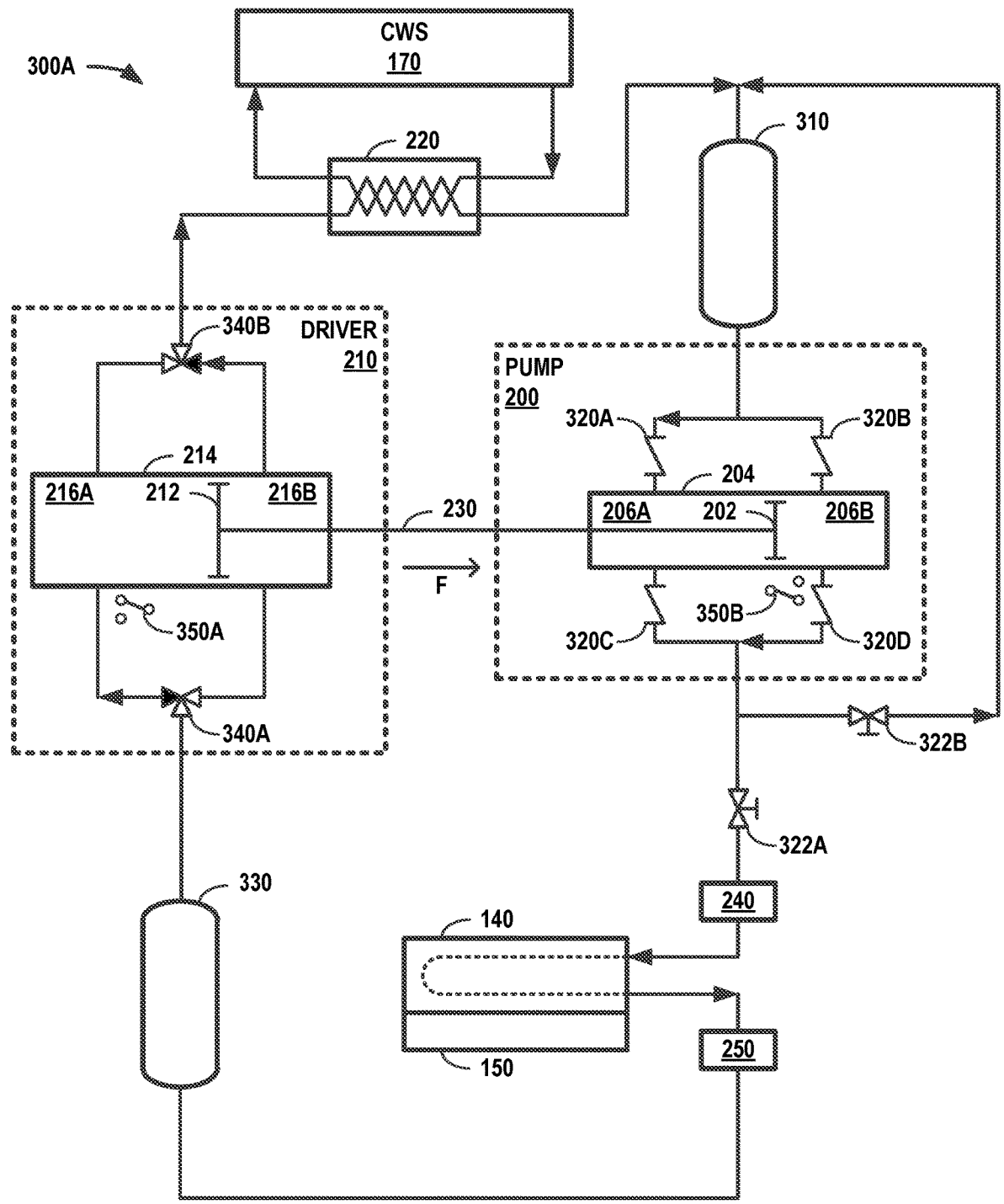
FIG. 4A is an example instrumentation diagram of the system of FIG. 3 at a first state A, in accordance with techniques described herein.

FIG. 4A is an example instrumentation diagram of the system 300A of FIG. 3 at a first state A, in accordance with techniques described herein. System 300A at state A may be configured to receive gaseous refrigerant from gas accumulator 330 into chamber 216A. Switch 350A may be in a "closed" position. Driver inlet valve 340A may direct gaseous refrigerant into chamber 216A while driver outlet valve 340B may direct gaseous refrigerant out of chamber 216B. This may pressurize chamber 216A and depressurize chamber 216B, creating a pressure differential across piston 212. Chamber 216A may expand and chamber 216B may collapse, which causes piston 212 to move to the right (in the example configuration and orientation of system 300 illustrated in FIGS. 3-4D). The movement of piston 212 to the right creates a mechanical force F to the right in mechanical link 230.

Mechanical link 230 exerts the mechanical force F on piston 202. Piston 202 moves to the right in response to the mechanical force F, expanding chamber 206A and collapsing chamber 206B. The expanding chamber 206A creates a suction that draws a first volume of liquid refrigerant through pump inlet valve 320A into chamber 206A from liquid receiver 310. Collapsing chamber 206B creates pressure that pushes a second volume of liquid refrigerant through pump outlet valve 320D into HEX 140 from chamber 206B.

Figure 4B:
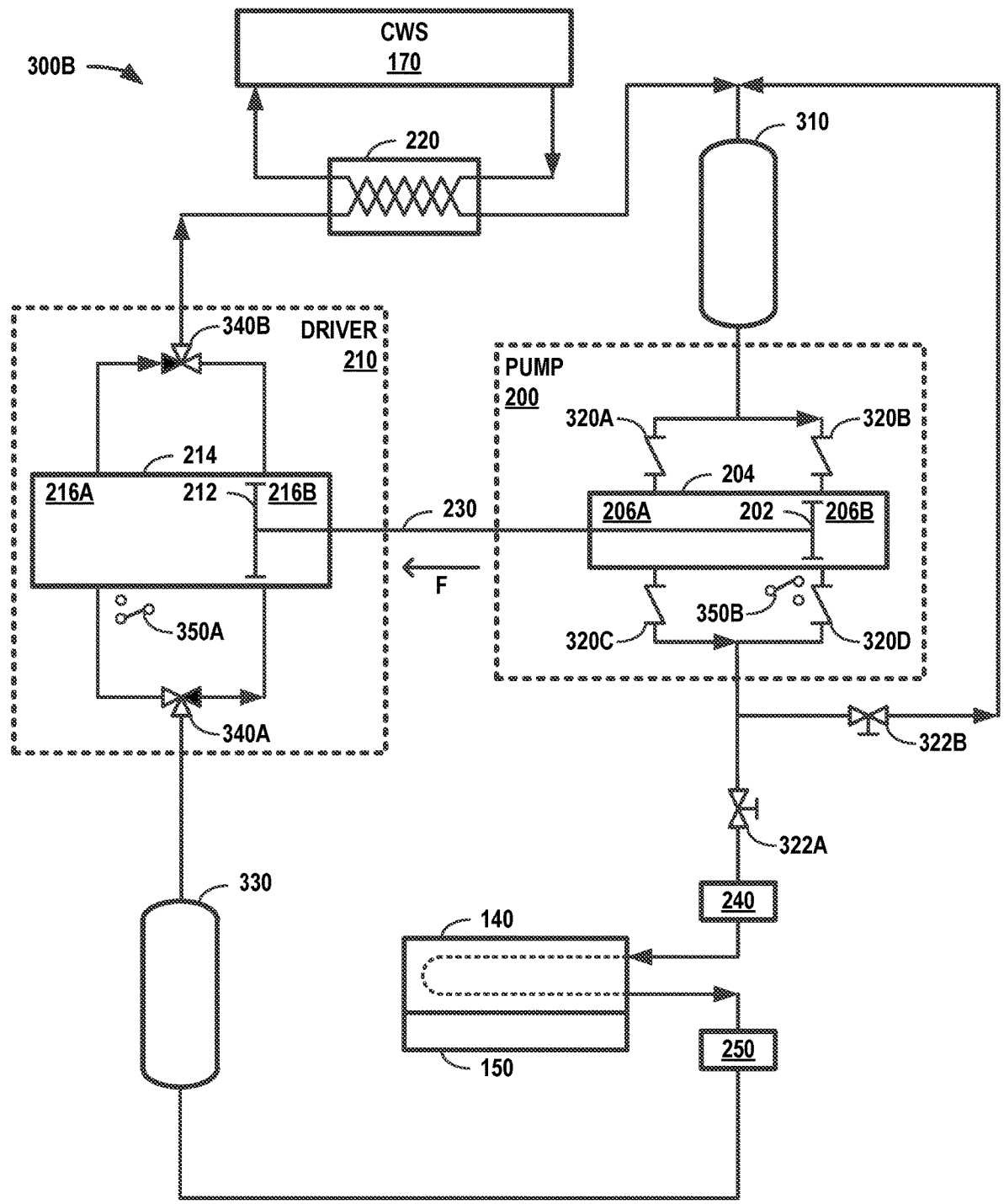
FIG. 4B is an example instrumentation diagram of the system of FIG. 3 transitioning from the first state A to a second state B, in accordance with techniques described herein.

FIG. 4B is an example instrumentation diagram of the system 300B of FIG. 3 transitioning from the first state A to a second state B. Piston 212 may move to a position that causes switch 350B to move to a "closed" position. The "closed" position of switch 350B may be associated with state B. The "closed" position of switch 350B may cause driver inlet valve 340A and driver outlet valve 340B to be "deenergized". Once deenergized, driver inlet valve 340A may direct gaseous refrigerant into chamber 216B while driver outlet valve 340B may direct gaseous refrigerant out of chamber 216A.

Figure 4C:
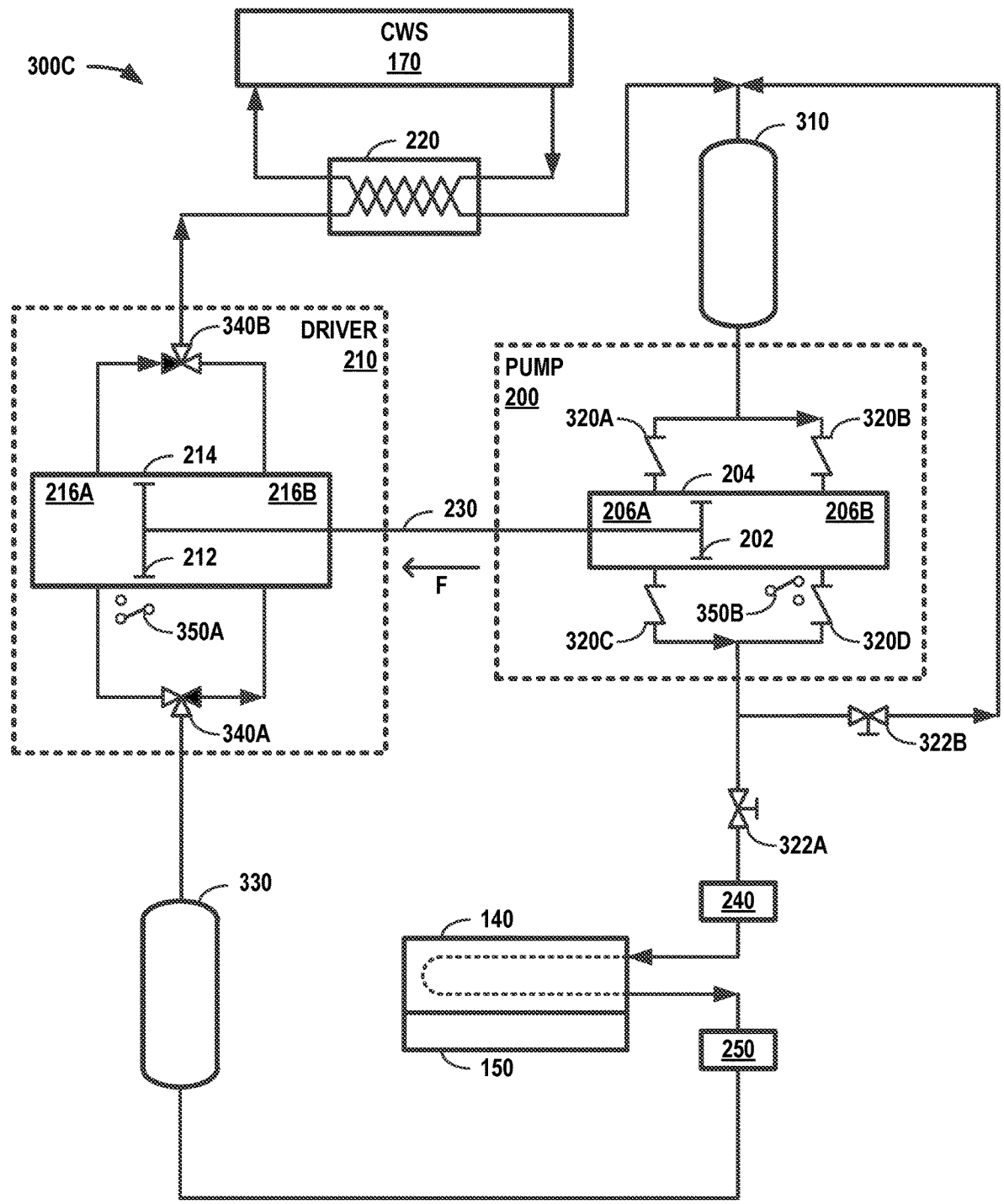
FIG. 4C is an example instrumentation diagram of the system of FIG. 3 at the second state B, in accordance with techniques described herein.

FIG. 4C is an example instrumentation diagram of the system 300C of FIG. 3 at the second state B, in accordance with techniques described herein. System 300B at state B may be configured to receive gaseous refrigerant into chamber 216B. Switch 350B may be in a "closed" position. Driver inlet valve 340A may direct gaseous refrigerant into chamber 216B while driver outlet valve 340B may direct gaseous refrigerant out of chamber 216A. This may pressurize chamber 216B and depressurize chamber 216A, creating a pressure differential across piston 212. Chamber 216B may expand and chamber 216A may collapse, which causes piston 212 to move to the left (in the example configuration and orientation of system 300 illustrated in FIGS. 3-4D). The movement of piston 212 to the left creates a mechanical force F to the left in mechanical link 230. Driver inlet valve 340A and driver outlet valve 340B operate in a reciprocal manner such that fluidical connectivity between the inlet of driver inlet valve 340A and outlet of driver outlet valve 340B is avoided. For example, in state B the inlet to driver outlet value 340B from driver chamber 216B is closed while the outlet of driver inlet value 340A to driver chamber 216B is open. In this way, direct fluidical connectivity between gas accumulator 330 and condenser 220 is avoided.

Mechanical link 230 exerts the mechanical force F on piston 202. Piston 202 moves to the left in response to the mechanical force F, expanding chamber 206B and collapsing chamber 206A. The expanding chamber 206B creates a suction that draws liquid refrigerant through pump inlet valve 320B into chamber 206B from liquid receiver 310. Collapsing chamber 206A creates pressure that pushes liquid refrigerant through pump outlet valve 320C into HEX 140 from chamber 206A.

Figure 4D:
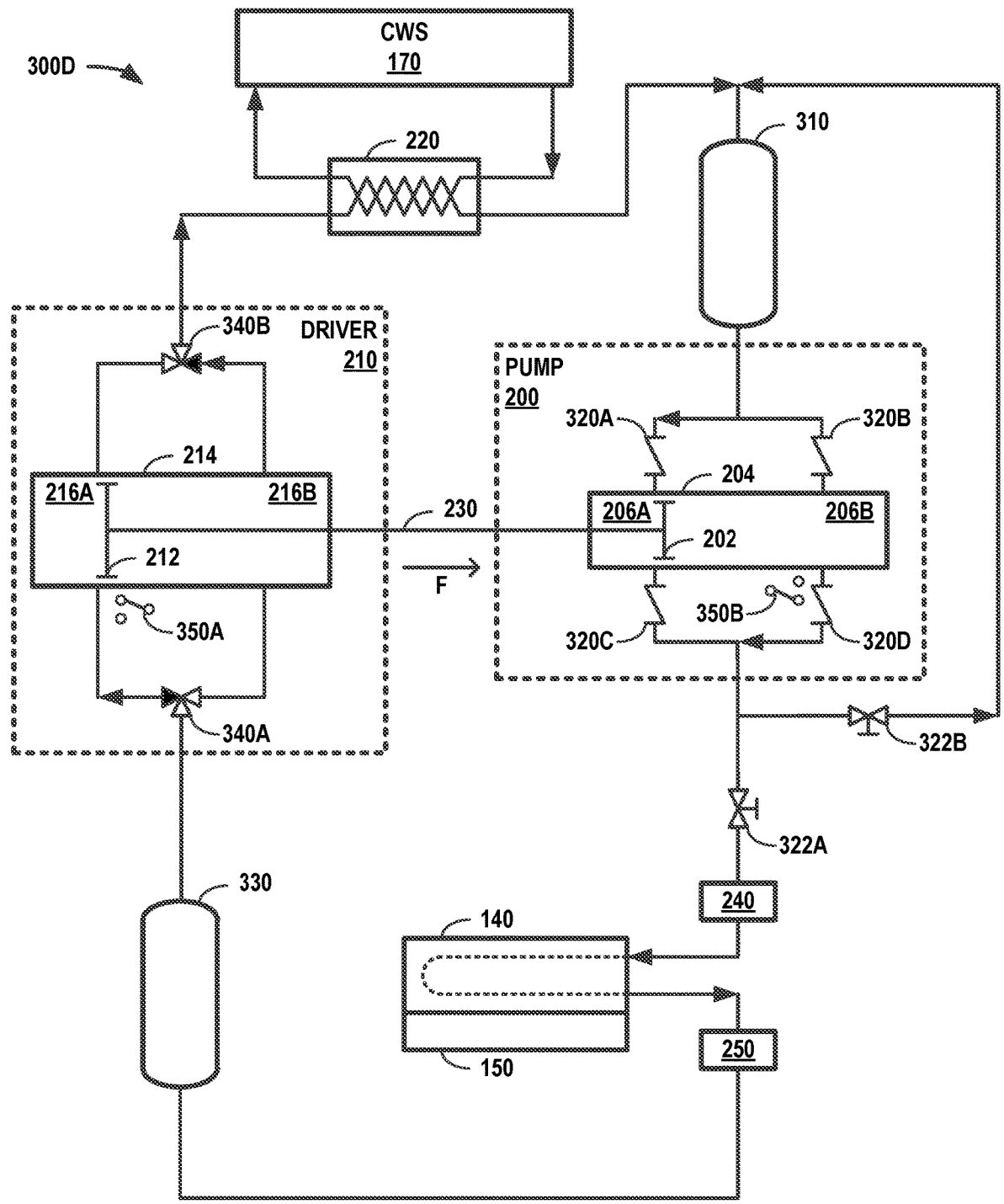
FIG. 4D is an example instrumentation diagram of the system of FIG. 3 transitioning from the second state B to the first state A, in accordance with techniques described herein.

FIG. 4D is an example instrumentation diagram of the system 300D of FIG. 3 transitioning from the second state B to the first state A. Piston 212 may move to a position that causes switch 350A to move to a "closed" position. The "closed" position of switch 350A may be associated with state A. The "closed" position of switch 350A may cause driver inlet valve 340A and driver outlet valve 340B to be "energized". Once energized, driver inlet valve 340A may direct gaseous refrigerant into chamber 216A while driver outlet valve 340B may direct gaseous refrigerant out of chamber 216B, as described in FIG. 4A.

Figure 5:
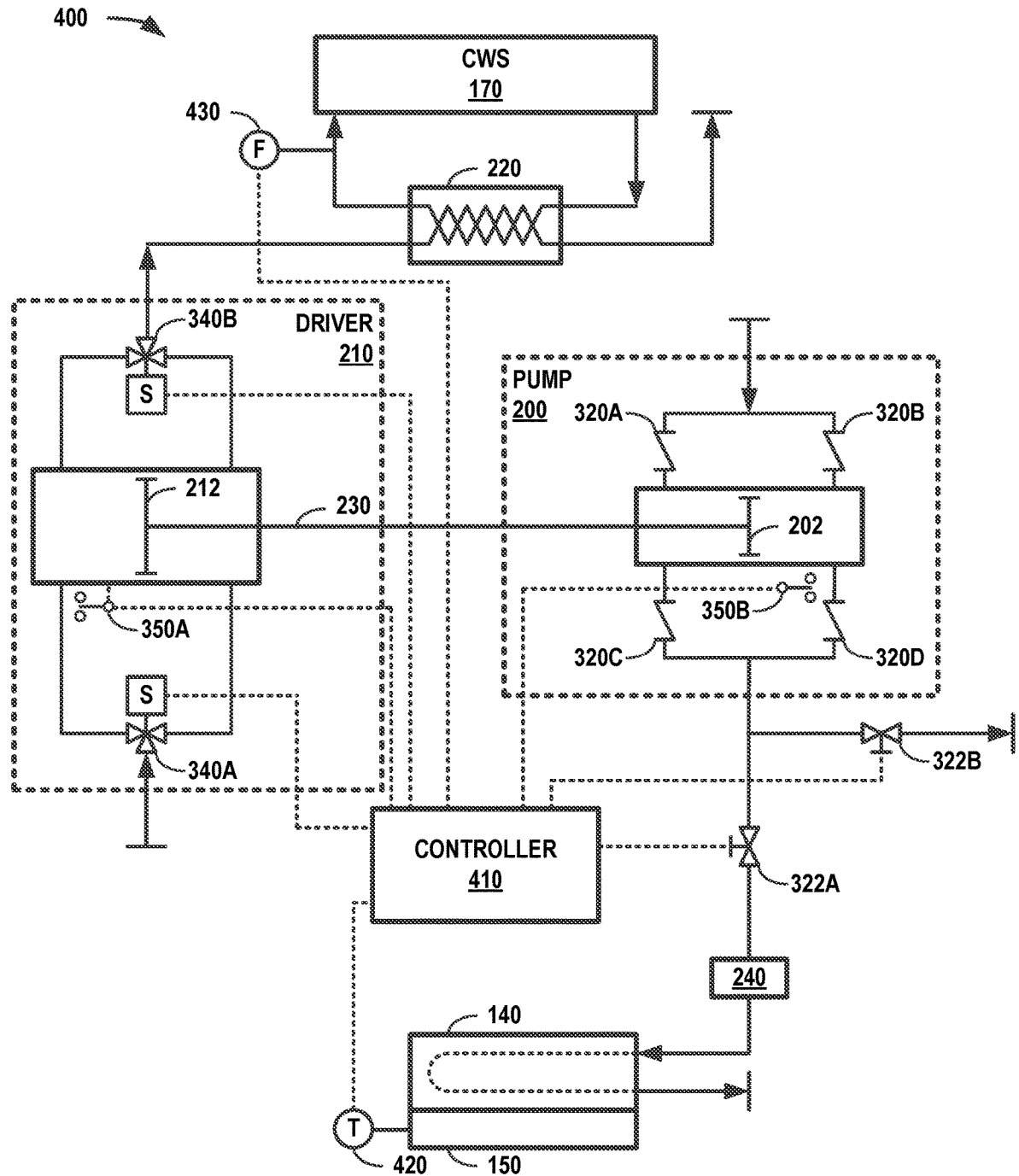
FIG. 5 is an example instrumentation diagram of a control system for the system of FIG. 3, in accordance with techniques described herein.

FIG. 5 is a diagram illustrating an example control system for particular components of FIG. 3. Control system 400 may include a controller 410 that is communicatively coupled to one or more components of a refrigeration system, such as refrigeration system 300 of FIG. 3.

Control system 400 may include controller 410. Controller 410 may be configured to receive signals and/or information from instrumentation and actuators in refrigeration system 100, as will be described below. Examples of controller 410 may include any one or more of a microprocessor, controller, digital signal processor (DSP), application specific integrated circuit (ASIC), field-programmable gate array (FPGA), or equivalent discrete or integrated logic circuitry. In some examples, controller 410 includes relays, power supplies, and data acquisition modules.

In some examples, controller 410 may be configured to direct components of driver 210 and/or pump 200, to create an alternating mechanical force. Controller 410 may be communicatively coupled to driver inlet valve 340A and driver outlet valve 340B. Driver valves 340 may each have circuitry that corresponds to a first state and a second state. In some examples, controller 410 may include switch circuitry configured to energize and deenergize driver valves 340 based on a position of a moveable driver barrier, a moveable pump barrier, mechanical link 230, or other component that changes position in conjunction with the mechanical force. The position of the moveable driver barrier or moveable pump barrier may indicate that a positional limit has been reached and that the mechanical force may be reversed. In other examples, other indicators for a limit may be used to trigger reversal of the mechanical force, such as a pressure limit, timing limit, flow limit, or the like. In the example of FIG. 5, each of driver valves 340 has a solenoid that has an energized and a deenergized state corresponding to a first position of the pistons 202, 212 and a second position of pistons 202, 212, respectively. Driver inlet valve 340A may be configured to supply gaseous refrigerant to driver chamber 216A in response to being energized and supply gaseous refrigerant to driver chamber 216B in response to being deenergized. Driver outlet valve 340B may be configured to discharge gaseous refrigerant from driver chamber 216B in response to being energized and discharge gaseous refrigerant from driver chamber 216A in response to being deenergized.

Controller 410 may be communicatively coupled to switches 350. Controller 410 may be configured to receive a status signal from each of switches 350 as to an "open" or "closed" state. In some examples, controller 410 may include relays that receive status from switches 350 as inputs for control of driver valves 330.

As an example, for a change in state from state A to state B discussed in FIGS. 4A and 4B above, controller 410 may receive a status from switch 350A indicating that piston 212 has reached a positional limit. In response to receiving the status, controller 410 may send a signal to a solenoid of driver inlet valve 340A and a solenoid of driver outlet valve 340B to energize, causing gaseous refrigerant to enter chamber 216A and causing gaseous refrigerant to exit 216B.

In some examples, controller 410 may be configured to monitor operating conditions of refrigeration system 100 and adjust parameters of refrigeration system 100 to control the operating conditions within particular limits. Controller 410 may be communicatively coupled to a temperature sensor 420. Temperature sensor 420 may be thermally coupled to CPU 150. Controller 410 may be configured to receive temperature signals from temperature sensor 420. Controller 410 may be communicatively coupled to flow regulating valves 322. For example, controller 410 may be configured to receive temperature signals from a thermocouple at an outlet of HEX 140 and send signals to an actuator on flow regulating valves 322 to adjust the actuator and, correspondingly, increase or decrease a flow rate of refrigerant to HEX 140 in response to the temperature of the outlet of HEX 140. Controller 410 may be communicatively coupled to a flow meter 430 on an inlet or outlet of condenser 220. Controller 410 may be configured to receive flow rate information and increase flow rate of cooling water to control a temperature of the refrigerant or temperature of cooling water return.

As an example, controller 410 may receive a temperature signal from temperature sensor 420 indicating that a temperature of CPU 150 is increasing. Controller 410 may send an actuator signal to flow regulating valves 322 to increase a refrigerant flow rate and decrease a recycle flow rate. Additionally, or alternatively, controller 410 may increase a cooling water flow rate from CWS 170 to lower a refrigerant temperature.

The techniques described herein may be implemented in hardware, software, firmware, or any combination thereof. Various features described as modules, units or components may be implemented together in an integrated logic device or separately as discrete but interoperable logic devices or other hardware devices. In some cases, various features of electronic circuitry may be implemented as one or more integrated circuit devices, such as an integrated circuit chip or chipset.

If implemented in hardware, this disclosure may be directed to an apparatus such as a processor or an integrated circuit device, such as an integrated circuit chip or chipset. Alternatively or additionally, if implemented in software or firmware, the techniques may be realized at least in part by a computer-readable data storage medium comprising instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may comprise a computer data storage medium such as random access memory (RAM), read-only memory (ROM), non-volatile random access memory (NVRAM), electrically erasable programmable read-only memory (EEPROM), Flash memory, magnetic or optical data storage media, and the like. In some examples, an article of manufacture may comprise one or more computer-readable storage media.

In some examples, the computer-readable storage media may comprise non-transitory media. The term "non-transitory" may indicate that the storage medium is not embodied in a carrier wave or a propagated signal. In certain examples, a non-transitory storage medium may store data that can, over time, change (e.g., in RAM or cache).

The code or instructions may be software and/or firmware executed by processing circuitry including one or more processors, such as one or more digital signal processors (DSPs), general purpose microprocessors, application-specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

Select examples of the present disclosure include, but are not limited to, the following:

In a first example, the present disclosure provides an apparatus, comprising:
 a driver mechanically coupled to a pump, the driver configured to:
  receive gaseous refrigerant at a first pressure;
  discharge gaseous refrigerant at a second pressure; and
  produce a mechanical force from a pressure differential between the first pressure and the second pressure;
 the pump configured to:
  receive liquid refrigerant at a third pressure;
  discharge liquid refrigerant at a fourth pressure; and
  pump liquid refrigerant from the third pressure to the fourth pressure in response to the mechanical force from the driver.

In a second example, the present disclosure provides an apparatus according to the first example, wherein the driver further comprises a first driver chamber and a second driver chamber separated by a moveable driver barrier coupled to a mechanical link, and wherein the driver is configured to alternately expand and contract the first and second driver chambers in response to an alternating pressure differential of the first and second driver chambers.

In a third example, the present disclosure provides an apparatus according to the second example, wherein the driver further comprises a 3-way inlet valve and a 3-way outlet valve each fluidically coupled to each of the first and second driver chambers, and wherein the driver is configured to create the pressure differential across the moveable driver barrier by alternately supplying gaseous refrigerant at the first pressure to one of the first and second driver chambers using the 3-way inlet valve and discharging gaseous refrigerant at the second pressure from the other of the first and second driver chambers using the 3-way outlet valve.

In a fourth example, the present disclosure provides an apparatus according to the second example, wherein the pump includes a first pump chamber and a second pump chamber separated by a moveable pump barrier coupled to the mechanical link, and wherein the pump is configured to alternately expand and contract the first and second pump chambers in response to the mechanical force.

In a fifth example, the present disclosure provides an apparatus according to the fourth example, further comprising a controller communicatively coupled to the driver, wherein the controller includes switch circuitry configured to energize or deenergize the 3-way inlet and outlet valves based on a position of the moveable driver barrier in the driver.

In a sixth example, the present disclosure provides an apparatus according to the fifth example, wherein:

the switch circuitry comprises a first switch adjacent the first driver chamber and a second switch adjacent one of the second driver chamber and the second pump chamber, the first switch is configured to close when the moveable driver barrier is positioned near the first switch and energize the 3-way inlet and outlet valves, the second switch is configured to close when the moveable driver barrier or moveable pump barrier is positioned near the second switch and deenergize the 3-way inlet and outlet valves, the 3-way inlet valve is configured to supply gaseous refrigerant to the first driver chamber in response to being energized and the second driver chamber in response to being deenergized, and the 3-way outlet valve is configured to discharge gaseous refrigerant from the second driver chamber in response to being energized and the first driver chamber in response to being deenergized.

In a seventh example, the present disclosure provides an apparatus according to any one of the first through sixth examples, wherein the driver is one of a piston driver and a diaphragm driver.

In an eighth example, the present disclosure provides an apparatus according to any one of the first through seventh examples, wherein the pump is one of a piston pump and a diaphragm pump.

In a ninth example, the present disclosure provides and apparatus according to any one of the second through eighth examples, wherein the mechanical link is configured to transfer the mechanical force to the pump.

In a tenth example, the present disclosure provides a system, comprising:

the apparatus of any one of the first through ninth examples;

a system inlet fluidically coupled to the driver, the system inlet configured to receive gaseous refrigerant at the first pressure from at least one heat exchanger;

a system outlet fluidically coupled to the pump, the system outlet configured to discharge liquid refrigerant at the second pressure to the at least one heat exchanger; and a condenser fluidically coupled to the driver and the pump, the condenser configured to condense gaseous refrigerant to liquid refrigerant.

In an eleventh example, the present disclosure provides a system according to the tenth example, wherein the at least one heat exchanger is thermally coupled to at least one processor.

In a twelfth example, the present disclosure provides a system according to the tenth or eleventh example, wherein the system inlet includes an inlet manifold and the system outlet includes an outlet manifold.

In a thirteenth example, the present disclosure provides a system according to any one of the tenth through twelfth examples, further comprising a liquid receiver fluidically coupled to the condenser and the pump, the liquid receiver configured to store the liquid refrigerant.

In a fourteenth example, the present disclosure provides a system according to any one of the tenth through thirteenth examples, further comprising a gas accumulator fluidically coupled to the system inlet and the driver, the gas accumulator configured to store the gaseous refrigerant.

In a fifteenth example, the present disclosure provides a system according to any one of the tenth through fourteenth examples, further comprising a flow regulating valve fluidically coupled to the pump and the system outlet, the flow regulating valve configured to control refrigerant flow through to the at least one heat exchanger.

In a sixteenth example, the present disclosure provides a system according to any one of the tenth through fifteenth examples, further comprising the at least one heat exchanger.

In a seventeenth example, the present disclosure provides a system according to the sixteenth example, wherein each of the at least one heat exchangers includes a plurality of channels, wherein each of the plurality of channels has a diameter less than or equal to about 1 mm.

In an eighteenth example, the present disclosure provides a system according to the tenth example, where the at least one heat exchanger is configured to remove heat generated by at least one computer processor executing within a data center.

In a nineteenth example, the present disclosure provides a method comprising:

receiving, by a system inlet, gaseous refrigerant from at least one heat exchanger, the system inlet fluidically coupled to a driver and the at least one heat exchanger;

producing, by the driver, an alternating mechanical force from an alternating pressure differential of the gaseous refrigerant, the driver mechanically coupled to a pump;

condensing, by a condenser, the gaseous refrigerant to a liquid refrigerant, the condenser fluidically coupled to the driver and the pump;

pumping, by the pump, the liquid refrigerant from the condenser to a system outlet in response to the mechanical force from the driver; and discharging, by the system outlet, the liquid refrigerant to the at least one heat exchanger, the system outlet fluidically coupled to the pump and the at least one heat exchanger.

In a twentieth example, the present disclosure provides a method according to the nineteenth example, wherein the driver further comprises a first driver chamber and a second driver chamber separated by a moveable driver barrier coupled to a mechanical link, and wherein producing, by the driver, the alternating mechanical force from the alternating pressure differential further comprises alternately expanding and contracting the first and second driver chambers in response to the alternating pressure differential.

In a twenty-first example, the present disclosure provides a method according to the twentieth example, wherein the driver further comprises a 3-way inlet valve and a 3-way outlet valve fluidically coupled to each of the first and second driver chambers, and further comprising creating, by the driver, the alternating pressure differential across the moveable driver barrier by alternately supplying gaseous refrigerant at the first pressure to one of the first and second driver chambers using the 3-way inlet valve and discharging gaseous refrigerant at the second pressure from the other of the first and second driver chambers.

In a twenty-second example, the present disclosure provides a method to the twentieth example, wherein the pump includes a first pump chamber and a second pump chamber separated by a moveable pump barrier coupled to the mechanical link, and wherein pumping, by the pump, liquid refrigerant further comprises alternately expanding and contracting the first and second pump chambers in response to the alternating mechanical force.

In a twenty-third example, the present disclosure provides a method according to the twenty-second example, wherein a controller is communicatively coupled to the driver.

In a twenty-fourth example, the present disclosure provides a method according to the twenty-second example, wherein the controller includes switch circuitry and wherein producing, by the driver, and alternating mechanical force further comprises energizing or deenergizing, by the switch circuitry, the 3-way inlet and outlet valves based on a position of the moveable driver barrier in the driver.

In a twenty-fifth example, the present disclosure provides a method according to the twenty-fourth example, wherein the switch circuitry comprises a first switch adjacent the first driver chamber and a second switch adjacent one of the second driver chamber and the second pump chamber, the first switch is configured to close when the moveable driver barrier is positioned near the first switch and energize the 3-way inlet and outlet valves, the second switch is configured to close when the moveable driver barrier or moveable pump barrier is positioned near the second switch and deenergize the 3-way inlet and outlet valves, wherein energizing, by the switch circuitry, the 3-way inlet and outlet valves further comprises supplying, by the 3-way inlet valve, gaseous refrigerant to the first driver chamber and discharging, by the 3-way outlet valve, gaseous refrigerant from the second driver chamber, and wherein deenergizing, by the switch circuitry, the 3-way inlet and outlet valves further comprises supplying, by the 3-way inlet valve, gaseous refrigerant to the second driver chamber and discharging, by the 3-way outlet valve, gaseous refrigerant from the first driver chamber.

In a twenty-sixth example, the present disclosure provides a method according to any one of the nineteenth through twenty-fifth examples, wherein the driver is one of a piston driver and a diaphragm driver.

In a twenty-seventh example, the present disclosure provides a method according to any one of the nineteenth through twenty-sixth examples, wherein the pump is one of a piston pump and a diaphragm pump.

In a twenty-eighth example, the present disclosure provides a method according to any one of the nineteenth through twenty-seventh examples, wherein the mechanical link is configured to transfer the mechanical force to the pump.

In a twenty-ninth example, the present disclosure provides a method according to any one of the nineteenth through twenty-eighth examples, wherein the at least one heat exchanger is thermally coupled to at least one processor.

In a thirtieth example, the present disclosure provides a method according to any one of the nineteenth through twenty-ninth examples, wherein the system inlet includes an inlet manifold and the system outlet includes an outlet manifold.

In a thirty-first example, the present disclosure provides a method according to any one of the nineteenth through thirtieth examples, further comprising a liquid receiver fluidically coupled to the condenser and the pump, the liquid receiver configured to store the liquid refrigerant.

In a thirty-second example, the present disclosure provides a method according to any one of the nineteenth through thirty-first examples, further comprising a gas accumulator fluidically coupled to the system inlet and the driver, the gas accumulator configured to store the gaseous refrigerant.

In a thirty-third example, the present disclosure provides a method according to any one of the nineteenth through thirty-second examples, further comprising a flow regulating valve fluidically coupled to the pump and the system outlet, the flow regulating valve configured to control refrigerant flow to the at least one heat exchanger.

In a thirty-fourth example, the present disclosure provides a method according to any one of the nineteenth through thirty-third examples, further comprising the at least one heat exchanger.

In a thirty-fifth example, the present disclosure provides a method according to the thirty-fourth example, wherein each of the at least one heat exchangers includes a plurality of channels.

In a thirty-sixth example, the present disclosure provides a method according to the thirty-fifth example, wherein each of the plurality of channels has a diameter less than or equal to about 1 mm.

In a thirty-seventh example, the present disclosure provides a method according to any one of the nineteenth through thirty-sixth examples, where the at least one heat exchanger is configured to remove heat generated by at least one computer processor executing within a data center.

In a thirty-eight example, the present disclosure provides a method according to the twenty-ninth example, wherein a junction temperature of the at least one processor is maintained below a temperature threshold by controlling a temperature and pressure of the refrigerant throughout the refrigeration cycle.

In a thirty-ninth example, the present disclosure provides any method or combination of methods described in this disclosure.

In a fortieth example, the present disclosure provides a computer readable storage medium comprising instructions that when executed, cause one or more processors to perform any combination of methods described in this disclosure.

In a forty-first example, the present disclosure provides a computer-readable storage medium comprising instructions that, when executed by at least one programmable processor of at least one computing device, cause the at least one computing device to perform any method or combination of methods described in this disclosure.

In a forty-second example, the present disclosure provides a computing device to perform any method or combination of methods described in this disclosure.

EXAMPLES

Example 1

Figure 7:
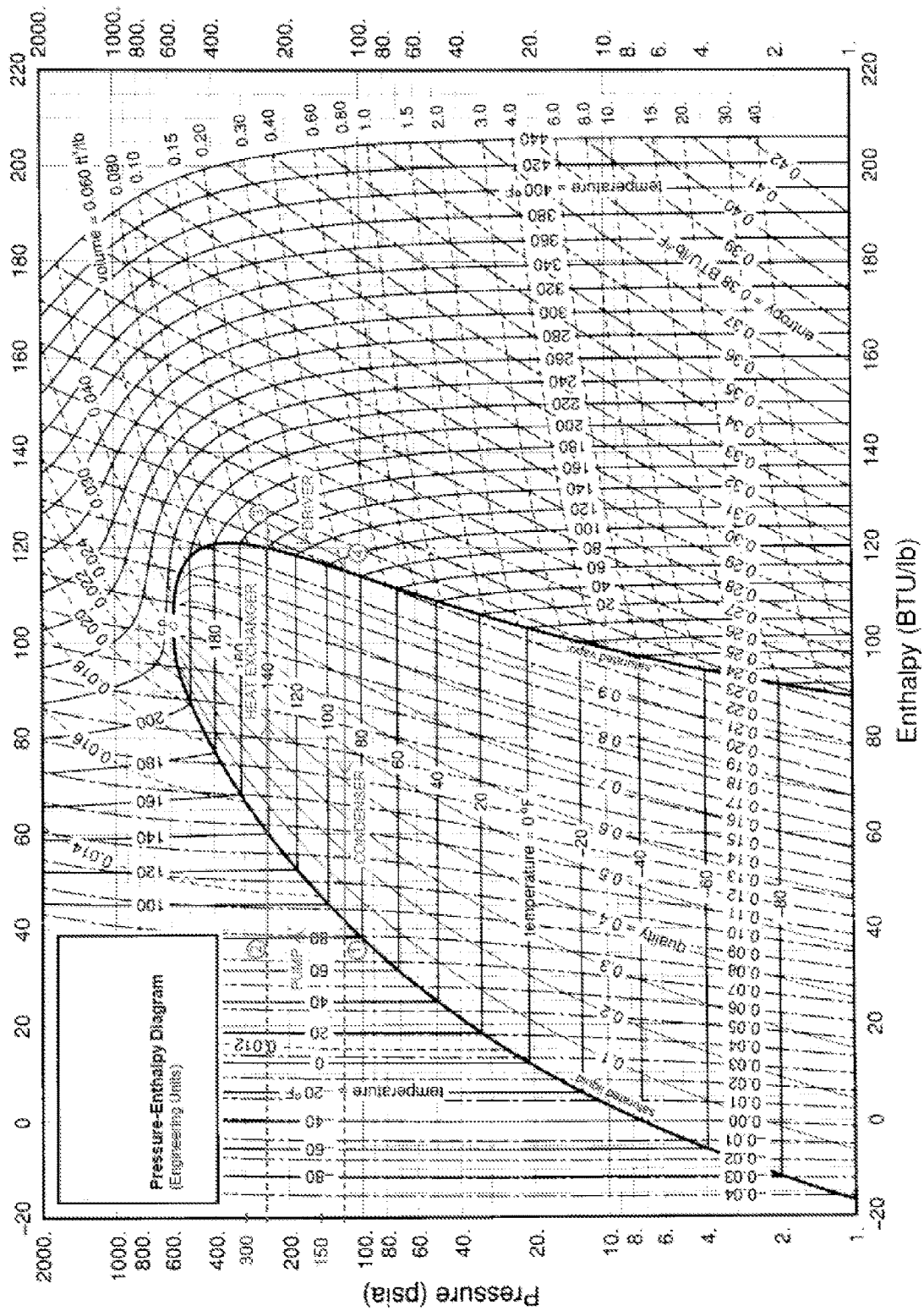
FIG. 7 is an exemplary pressure-enthalpy diagram for a refrigerant in a refrigerant system, in accordance with techniques described herein.

A simulation was performed on a refrigeration system, such as the refrigeration system of FIG. 3. Reference will be made to FIG. 7, which is a diagram of a pressure-enthalpy diagram for a refrigerant. In this example, HFC-134a was used.

Pumping: Subcooled liquid is pumped between (1) and (2), which increases a pressure from 119.1 psia to 240 psia at constant temperature. The enthalpy of the liquid refrigerant increases from 38.1 BTU/lb to 38.5 BTU/lb.

CPU Cooling: CPU cooling occurs between (2) and (3). Refrigerant is heated from a subcooled liquid at 80° F. to a superheated gas at 150° F. at constant pressure. The enthalpy of the refrigerant increases from 38.5 BTU/lb to 123.3 BTU/lb.

Pump Power: For the CPU to reject 1 kW (3412 BTU/hr) of heat requires 40.24 lb/hr of refrigerant. To pump 40.24 lb/hr of liquid refrigerant at 80° F. and an efficiency of 75% would require a power of 0.0075 bhp, or 0.00559 kWh for one hour of pumping in this example.

Driver Expanding: Driver expansion occurs between (3) and (4). Gaseous refrigerant on a high-pressure side is maintained at 150° F. and 240 psia, while gaseous refrigerant on a low-pressure side is cooled and depressurized at constant entropy (isentropic) to 97° F. and 120 psia. The enthalpy of the gaseous refrigerant on the low-pressure side decreases from 123.3 BTU/lb to 117.1 BTU/lb. The resulting Carnot efficiency is 8.68%. For an available thermal energy of 0.0731 kWh, the usable thermal energy is 0.00635 kWh in this example.

Refrigerant Cooling: Refrigerant cooling occurs between (4) and (1). Gaseous refrigerant is cooled and condensed from 97° F. to 80° F. at substantially constant pressure. The enthalpy of the refrigerant decreases from 117.1 BTU/lb to 38.1 BTU/lb.

The table below summarizes the refrigerant properties at state points (1)-(4) for the simulation described above.

| | | Refrigerant Properties | | | |
|---|---|---|---|---|---|
| State Point | T (° F.) | P (psia) | h (BTU/lb) | s (BTU/lb) | ρ (lb/ft$^3$) |
| (1) | 80 | 119.1 | 38.1 | 0.0855 | 74.75 |
| (2) | 80 | 240 | 38.5 | 0.0855 | 74.75 |
| (3) | 150 | 240 | 123.3 | 0.2227 | 5.05 |
| (4) | 97 | 120 | 117.1 | 0.2227 | 2.46 |

Example 2

Figure 8:
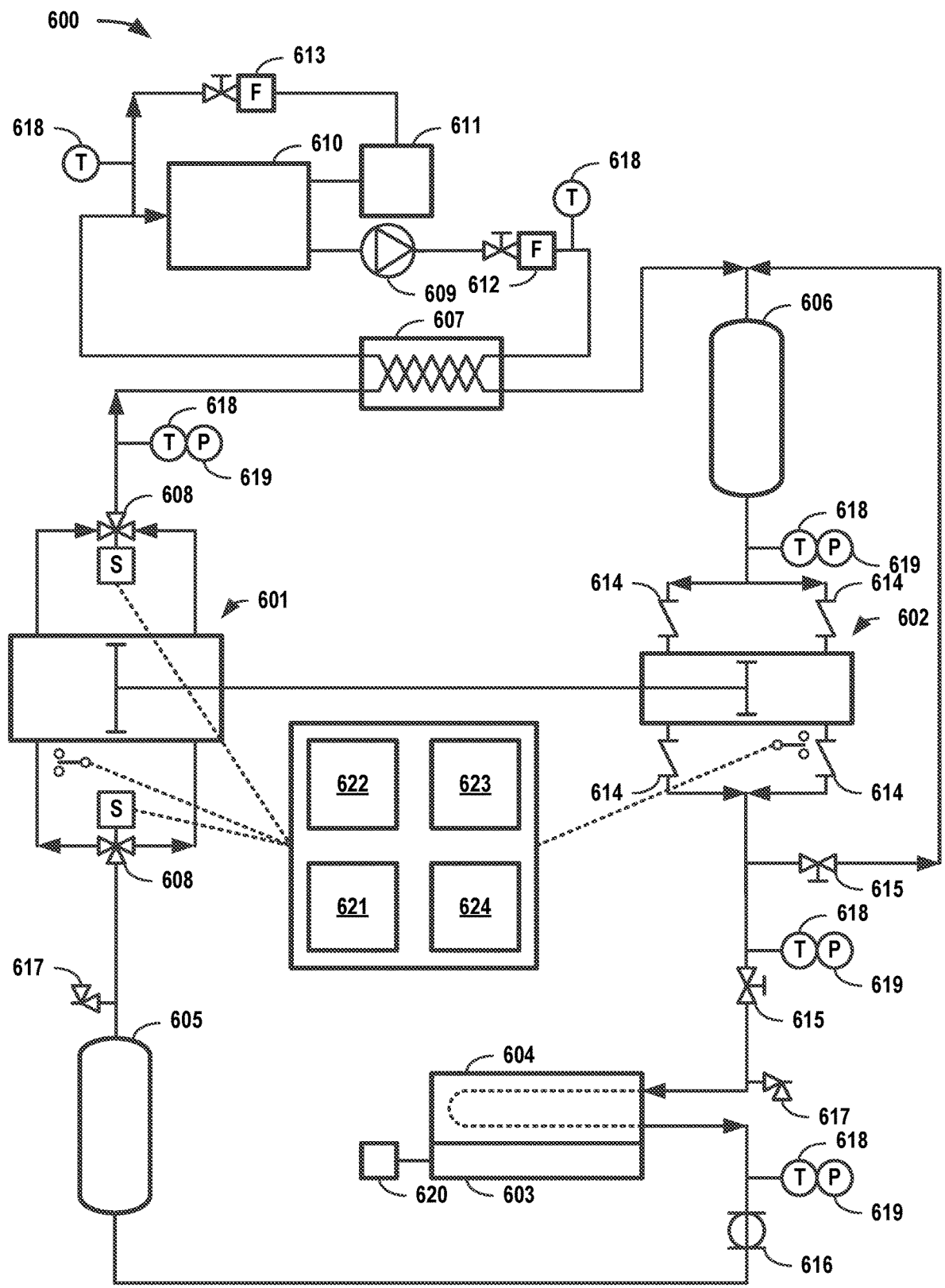
FIG. 8 is a diagram of a prototype system for removing heat from a processor.

FIG. 8 is a diagram of a prototype system for removing heat from a processor. The prototype of FIG. 8 may be similar to the refrigeration system of FIG. 3. Prototype 600 of FIG. 8 may be configured to test the refrigeration system and determine operational limits of the refrigeration system. The following components may be assembled as indicated in FIG. 8, and as described below

| Label | Component |
|---|---|
| 601a | Driver Cylinder: 1⅛" Dia × ½" Stroke with single end switch |
| 601b | Driver Cylinder: ⅞" Dia × ½" Stroke with single end switch |
| 601c | Driver Cylinder: ¾" Dia × ½" Stroke with single end switch |
| 602a | Pump Cylinder: 1⅛" Dia × ½" Stroke with single end switch |
| 602b | Pump Cylinder: ⅞" Dia × ½" Stroke with single end switch |
| 602c | Pump Cylinder: ¾" Dia × ½" Stroke with single end switch |
| 603 | 250 W Heater Pad, 120 V |
| 604 | Microchannel Heat Exchanger: Precision ground 6061 aluminum bar stock, 1" × ¾" × 12" |
| 605 | Gas Accumulator: 150 cc sample cylinder |
| 606 | Liquid Receiver: 150 cc sample cylinder |
| 607 | Condenser: ½" × ¼" × 10' copper tube-in-tube heat exchanger with ½" T × ⅜" FNPT run tees |
| 608 | Driver Supply/Exhaust 3-way Solenoid Valve |
| 609 | Condenser Water Pump: 1.52 gpm @ 20 psi |
| 610 | Condenser Water Tank: 5 gal |
| 611 | Heat Removal Ice Bath Tank: 2 gal |
| 612 | Condenser Water Flow Meter 1-12 gph rotameter w/ flow control valve |
| 613 | Ice Bath Makeup Flow Meter: 0.7-7 gph rotameter w/ flow control valve |
| 614 | Pump Check Valve: ⅛" NPT brass, 1 psi |
| 615 | Refrigerant Liquid Flow Control Valve: ⅛" needle valve, brass |
| 616 | Refrigerant Gas Isolation Valve: ¼" ball valve, brass |
| 617 | Pressure Relief Valve: ⅜" NPT brass, 250 psi |
| 618 | Temperature Sensor: Type T thermocouple probe assembly w/ compression fitting |
| 619 | Pressure Transmitter: Stainless steel, 600 psia |
| 620 | Power Meter |
| 621 | Data Acquisition Module, 16 channel |
| 622 | Driver Supply/Exhaust Activating Solid State Relay |
| 623 | Driver Supply/Exhaust Deactivating Solid State Relay |
| 624 | DC Power Supply: 24 VDC @ 5 A, 120 VAC In |

Sub-cooled liquid refrigerant may be accumulated in the liquid receiver 606 and pumped using pump cylinder 602 and pump check valves 614 to increase refrigerant pressure. Pumping action may be achieved by a reciprocating diaphragm in pump cylinder 602 that is driven by superheated vapor at the opposite end of the refrigeration cycle.

Pressurized liquid refrigerant is distributed to a microchannel heat exchanger 604 coupled to a heater pad 603. Liquid refrigerant may pass through microchannel heat exchanger 604 and absorb heat as it evaporates. Liquid refrigerant flow control valves 615 may be used to control the superheat of the exiting vapor.

The superheated gaseous refrigerant may be collected in a gas accumulator and is used as the motive force to displace a diaphragm in driver cylinder 601. The reciprocating action of the diaphragm is effected by two 3-way solenoid valves 608 that alternately expose the driver diaphragm to hot vapor pressure.

With solenoid valves 608 de-energized, a diaphragm chamber of the driver cylinder 601 is configured such that the inlet to a first side of the diaphragm is open while the outlet is blocked, and the inlet to a second side of the diaphragm is blocked while the outlet is open. This may allow pressurized vapor to enter the first side of the diaphragm, which will expand and displace the diaphragm towards the second side and displace the gas in the second side from the previous cycle. When the diaphragm is fully displaced within the chamber, single end switches will energize the two solenoid valves 608.

When the two solenoid valves 608 are energized, the inlet to the second side of the diaphragm will not open while the outlet will close, and the inlet to the first side of the diaphragm will close while the outlet will open. This may allow pressurized vapor to enter the second side of the diaphragm which will expand and displace the diaphragm towards the first side and displace the gas in the first side from the previous cycle. When the diaphragm is fully displaced within the chamber, the single end switches will de-energize the two solenoid valves 608. The diaphragm will continue to reciprocate to create a continuously flowing refrigeration cycle.

After exiting driver cylinder 601, the hot gaseous refrigerant may enter condenser 607 to be cooled and condensed to sub-cooled liquid using water supplied from a water facility. The liquid refrigerant may be discharged into liquid receiver 606 to repeat the refrigeration cycle.

Various embodiments have been described. These and other embodiments are within the scope of the following examples.

What is claimed is:

1. An apparatus, comprising:
   a driver mechanically coupled to a pump, wherein the driver comprises a first driver chamber and a second driver chamber separated by a moveable driver barrier coupled to a mechanical link, and wherein the driver is configured to:
   receive gaseous refrigerant at a first pressure;
   discharge gaseous refrigerant at a second pressure;
   alternately expand and contract the first and second driver chambers in response to an alternating pressure differential between the first pressure and the second pressure of the first and second driver chambers; and
   produce a mechanical force from the alternating pressure differential;
   the pump configured to:
   receive liquid refrigerant at a third pressure;
   discharge liquid refrigerant at a fourth pressure; and
   pump liquid refrigerant from the third pressure to the fourth pressure in response to the mechanical force from the driver.

2. The apparatus of claim 1, wherein the driver further comprises a 3-way inlet valve and a 3-way outlet valve each fluidically coupled to each of the first and second driver chambers, and wherein the driver is configured to create the alternating pressure differential across the moveable driver barrier by alternately supplying gaseous refrigerant at the first pressure to one of the first and second driver chambers using the 3-way inlet valve and discharging gaseous refrigerant at the second pressure from the other of the first and second driver chambers using the 3-way outlet valve.

3. The apparatus of claim 1, wherein the pump includes a first pump chamber and a second pump chamber separated by a moveable pump barrier coupled to the mechanical link, and wherein the pump is configured to alternately expand and contract the first and second pump chambers in response to the mechanical force.

4. The apparatus of claim 2, further comprising a controller communicatively coupled to the driver, wherein the controller includes switch circuitry configured to energize or deenergize the 3-way inlet and outlet valves based on a position of the moveable driver barrier in the driver.

5. The apparatus of claim 4, wherein:
the switch circuitry comprises a first switch adjacent the first driver chamber and a second switch adjacent one of the second driver chamber and the second pump chamber,
the first switch is configured to close when the moveable driver barrier is positioned near the first switch and energize the 3-way inlet and outlet valves,
the second switch is configured to close when the moveable driver barrier or moveable pump barrier is positioned near the second switch and deenergize the 3-way inlet and outlet valves,
the 3-way inlet valve is configured to supply gaseous refrigerant to the first driver chamber in response to being energized and the second driver chamber in response to being deenergized, and
the 3-way outlet valve is configured to discharge gaseous refrigerant from the second driver chamber in response to being energized and the first driver chamber in response to being deenergized.

6. The apparatus of claim 1, wherein the driver is one of a piston driver and a diaphragm driver, and wherein the pump is one of a piston pump and a diaphragm pump.

7. A system, comprising:
a driver mechanically coupled to a pump, wherein the driver comprises a first driver chamber and a second driver chamber separated by a moveable driver barrier coupled to a mechanical link, and wherein the driver is configured to:
receive gaseous refrigerant at a first pressure;
discharge gaseous refrigerant at a second pressure;
alternately expand and contract the first and second driver chambers in response to an alternating pressure differential between the first pressure and the second pressure of the first and second driver chambers; and
produce a mechanical force from the alternating pressure differential;
the pump configured to:
receive liquid refrigerant at a third pressure;
discharge liquid refrigerant at a fourth pressure; and
pump liquid refrigerant from the third pressure to the fourth pressure in response to the mechanical force from the driver;
a system inlet fluidically coupled to the driver, the system inlet configured to receive gaseous refrigerant at the first pressure from at least one heat exchanger;
a system outlet fluidically coupled to the pump, the system outlet configured to discharge liquid refrigerant at the second pressure to the at least one heat exchanger; and
a condenser fluidically coupled to the driver and the pump, the condenser configured to condense gaseous refrigerant to liquid refrigerant.

8. The system of claim 7, wherein the system inlet includes an inlet manifold and the system outlet includes an outlet manifold.

9. The system of claim 7, further comprising a liquid receiver fluidically coupled to the condenser and the pump, the liquid receiver configured to store the liquid refrigerant.

10. The system of claim 7, further comprising a gas accumulator fluidically coupled to the system inlet and the driver, the gas accumulator configured to store the gaseous refrigerant.

11. The system of claim 7, further comprising a flow regulating valve fluidically coupled to the pump and the system outlet, the flow regulating valve configured to control refrigerant flow through to the at least one heat exchanger.

12. The system of claim 7, wherein each of the at least one heat exchanger includes a plurality of channels, wherein each of the plurality of channels has a diameter less than or equal to about 1 mm.

13. The system of claim 7, where the at least one heat exchanger is configured to remove heat generated by at least one computer processor executing within a data center.

14. A method comprising:
receiving, by a system inlet, gaseous refrigerant from at least one heat exchanger, the system inlet fluidically coupled to a driver and the at least one heat exchanger, wherein the driver further comprises a first driver chamber and a second driver chamber separated by a moveable driver barrier coupled to a mechanical link, and wherein the first and second driver chambers alternately expand and contract in response to an alternating pressure differential of the gaseous refrigerant between the first and second driver chambers;
producing, by the driver, an alternating mechanical force from the alternating pressure differential of the gaseous refrigerant, the driver mechanically coupled to a pump through the mechanical link;
condensing, by a condenser, the gaseous refrigerant to a liquid refrigerant, the condenser fluidically coupled to the driver and the pump;
pumping, by the pump, the liquid refrigerant from the condenser to a system outlet in response to the alternating mechanical force from the driver; and
discharging, by the system outlet, the liquid refrigerant to the at least one heat exchanger, the system outlet fluidically coupled to the pump and the at least one heat exchanger.

15. The method of claim 14, wherein the driver further comprises a 3-way inlet valve and a 3-way outlet valve fluidically coupled to each of the first and second driver chambers, and further comprising creating, by the driver, the alternating pressure differential across the moveable driver barrier by alternately supplying gaseous refrigerant at the first pressure to one of the first and second driver chambers using the 3-way inlet valve and discharging gaseous refrigerant at the second pressure from the other of the first and second driver chambers.

16. The method of claim 14, wherein the pump includes a first pump chamber and a second pump chamber separated by a moveable pump barrier coupled to the mechanical link, and wherein pumping, by the pump, liquid refrigerant further comprises alternately expanding and contracting the first and second pump chambers in response to the alternating mechanical force.

17. The method of claim 15, wherein a controller is communicatively coupled to the driver, wherein the controller includes switch circuitry, and wherein producing, by the driver, the alternating mechanical force further comprises energizing or deenergizing, by the switch circuitry, the 3-way inlet and outlet valves based on a position of the moveable driver barrier in the driver.

18. The method of claim 17, wherein the switch circuitry comprises a first switch adjacent the first driver chamber and a second switch adjacent one of the second driver chamber and the second pump chamber, the first switch is configured to close when the moveable driver barrier is positioned near the first switch and energize the 3-way inlet and outlet valves, the second switch is configured to close when the moveable driver barrier or moveable pump barrier is positioned near the second switch and deenergize the 3-way inlet and outlet valves,
  wherein energizing, by the switch circuitry, the 3-way inlet and outlet valves further comprises supplying, by the 3-way inlet valve, gaseous refrigerant to the first driver chamber and discharging, by the 3-way outlet valve, gaseous refrigerant from the second driver chamber, and
  wherein deenergizing, by the switch circuitry, the 3-way inlet and outlet valves further comprises supplying, by the 3-way inlet valve, gaseous refrigerant to the second driver chamber and discharging, by the 3-way outlet valve, gaseous refrigerant from the first driver chamber.

19. The apparatus of claim 1, wherein the moveable driver barrier comprises a diaphragm.

\* \* \* \* \*